(12) United States Patent
Uchida et al.

(10) Patent No.: US 8,651,912 B2
(45) Date of Patent: Feb. 18, 2014

(54) ORGANIC EL ELEMENT, METHOD FOR MANUFACTURING THE SAME, AND ORGANIC EL LIGHTING APPARATUS

(75) Inventors: Hideki Uchida, Osaka (JP); Tokiyoshi Umeda, Osaka (JP); Tohru Sonoda, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 114 days.

(21) Appl. No.: 13/380,599

(22) PCT Filed: Jun. 3, 2010

(86) PCT No.: PCT/JP2010/003714
§ 371 (c)(1),
(2), (4) Date: Dec. 23, 2011

(87) PCT Pub. No.: WO2011/001599
PCT Pub. Date: Jan. 6, 2011

(65) Prior Publication Data
US 2012/0098420 A1    Apr. 26, 2012

(30) Foreign Application Priority Data
Jul. 2, 2009    (JP) .................................. 2009-157446

(51) Int. Cl.
*H01J 9/02*    (2006.01)
(52) U.S. Cl.
USPC ........................................... 445/35; 313/504
(58) Field of Classification Search
USPC ......................... 445/35, 24–25; 313/498–512
See application file for complete search history.

(56) References Cited

U.S. PATENT DOCUMENTS

| | | |
|---|---|---|
| 6,695,030 B1 | 2/2004 | Phillips et al. |
| 2004/0028942 A1 | 2/2004 | Culver et al. |
| 2006/0243377 A1 | 11/2006 | Matsuo et al. |
| 2008/0268561 A1 | 10/2008 | Ikeda et al. |

FOREIGN PATENT DOCUMENTS

| | | |
|---|---|---|
| JP | 2003-77657 A | 3/2003 |
| JP | 2003-264076 A | 9/2003 |
| JP | 2004-71551 A | 3/2004 |
| JP | 2004-79540 A | 3/2004 |
| JP | 2006-309994 A | 11/2006 |
| JP | 2006-344459 A | 12/2006 |
| JP | 2008-293961 A | 12/2008 |

OTHER PUBLICATIONS

International Search Report received for PCT Patent Application No. PCT/JP2010/003714, mailed on Sep. 7, 2010, 5 pages (2 pages of English Translation and 3 pages of PCT Search Report).

*Primary Examiner* — Anne Hines
(74) *Attorney, Agent, or Firm* — Morrison & Foerster LLP

(57) ABSTRACT

An anode 2 is formed on an element substrate 1. By using a film-forming solution containing a stacking material that forms an organic layer 43, a film is formed on a donor substrate 10 to form a transfer layer 11, thereby fabricating a transfer substrate 12. The transfer substrate 12 and the element substrate 1 are placed so as to face each other with spacers 13 interposed therebetween, such that the surface of the transfer substrate 12, which has the transfer layer 11 formed thereon, faces the element substrate 1 having the anode 2 formed thereon. The transfer substrate 12 and the element substrate 1 facing each other are held under vacuum conditions. The transfer substrate 12 is heated by the heat source 15 under the vacuum conditions to transfer the transfer layer 11 to the element substrate 1.

35 Claims, 23 Drawing Sheets

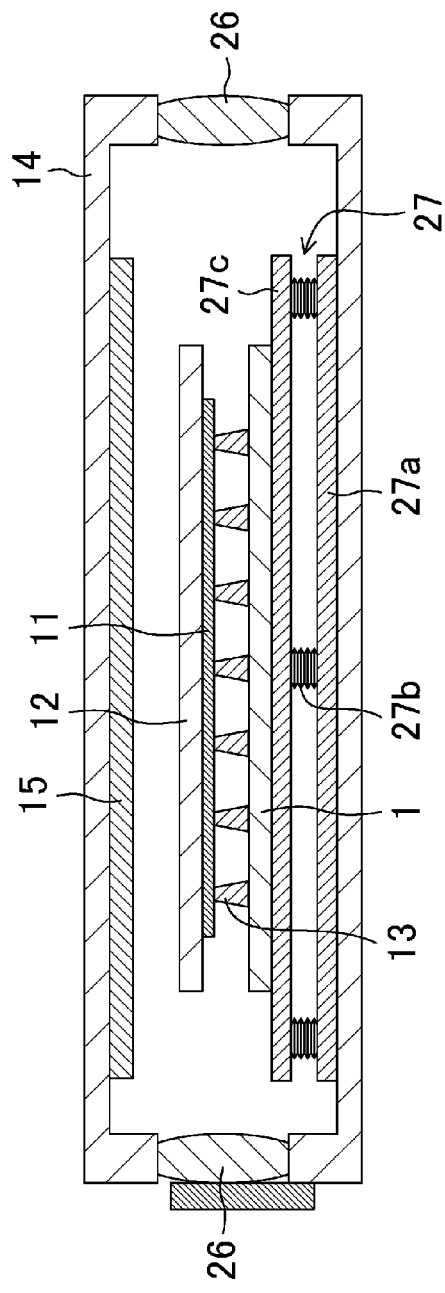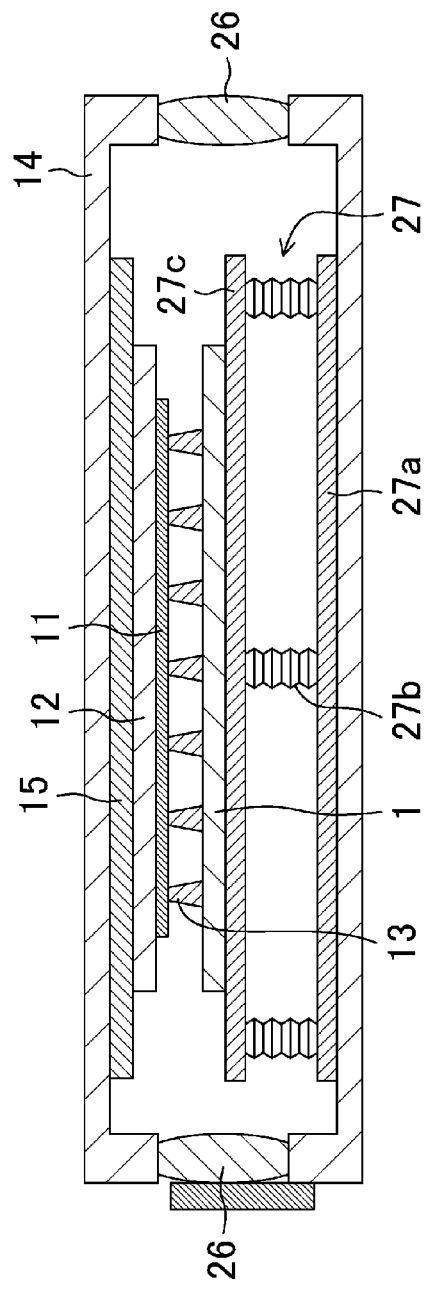

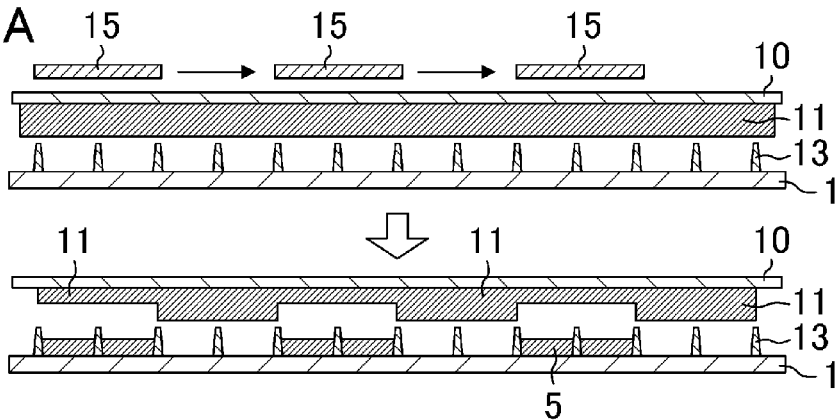
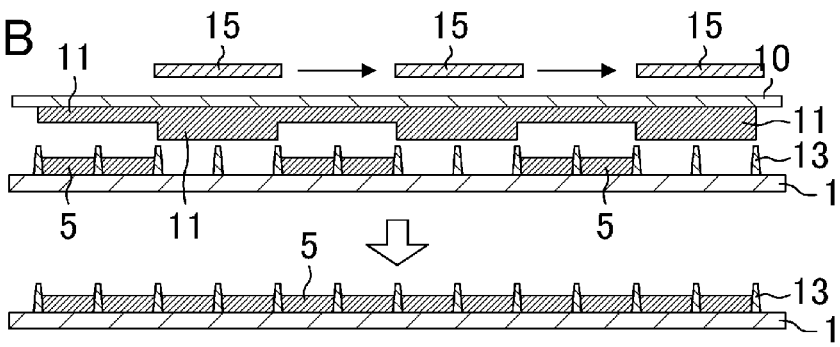
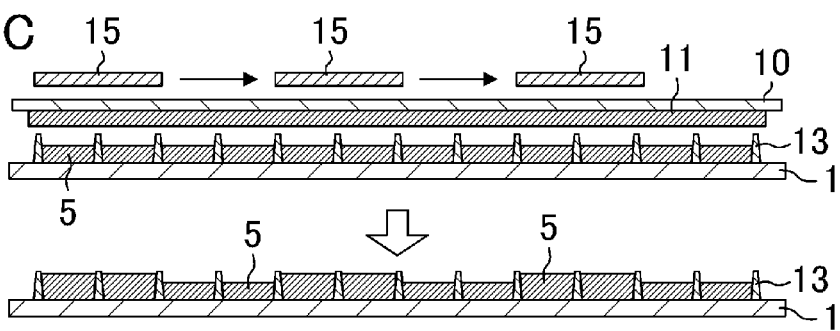
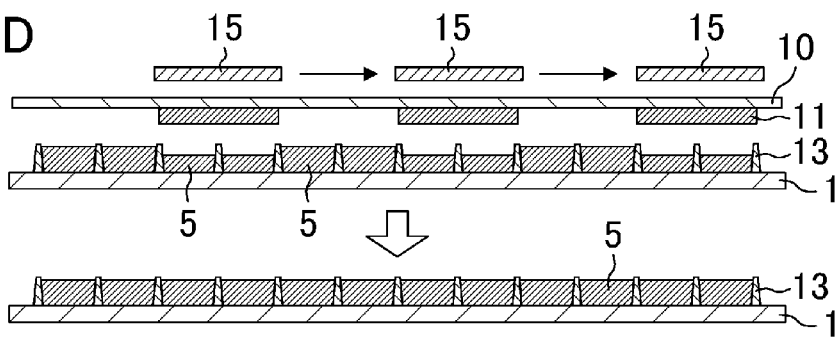

FIG.34
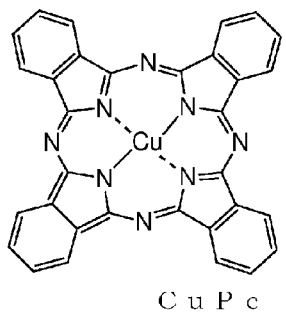
CuPc
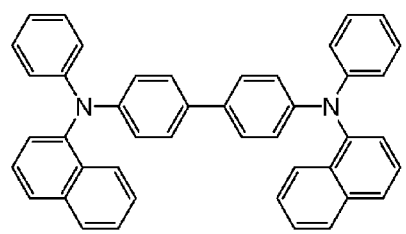
α-NPB
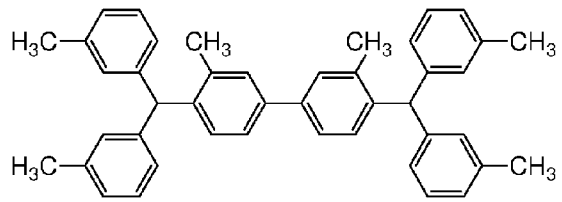
HMTPD
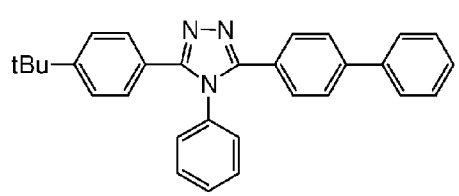
TAZ
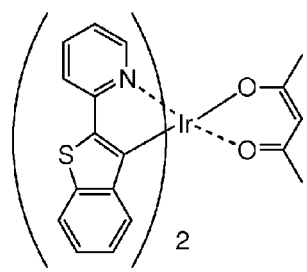
BtpIr(acac)
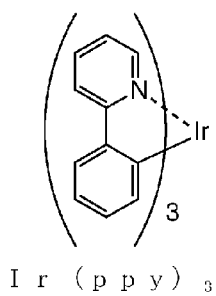
Ir(ppy)₃
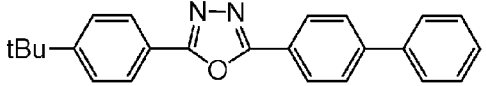
tBu-PBD
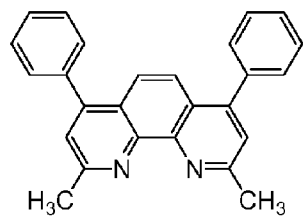
BCP

ORGANIC EL ELEMENT, METHOD FOR MANUFACTURING THE SAME, AND ORGANIC EL LIGHTING APPARATUS

CROSS REFERENCE TO RELATED APPLICATIONS

This is a U.S. National Phase patent application of PCT/JP2010/003714, filed Jun. 3, 2010, which claims priority to Japanese Patent Application No. 2009-157446, filed Jul. 2, 2009, each of which is hereby incorporated by reference in the present disclosure in its entirety.

TECHNICAL FIELD

The present invention relates to organic electroluminescence (EL) elements, methods for fabricating the same, and organic EL lighting apparatuses using the same.

BACKGROUND ART

Recently, organic EL elements have been actively developed. Displays using organic EL elements need neither backlights nor polarizers, and have a wide dynamic range and a wide viewing angle, which is advantageous for reduction in thickness and cost. Thus, the organic EL elements have been expected to be used in next-generation displays. The organic EL elements have also been expected to be used in lighting apparatuses due to their low power consumption.

In typical organic EL elements, an organic EL layer that emits light in response to application of a voltage is provided between a thin-film like anode and a thin-film like cathode, and a hole injection layer, a hole transport layer, a light emitting layer, a hole blocking layer, an electron transfer layer, etc. are stacked in the organic EL layer. These layers in the organic EL layer are often formed by vacuum deposition (a vacuum deposition method), but in some cases, are formed by coating using spin coating etc. (a coating method).

A method has been proposed in which a mixed film is formed on a first substrate by a vacuum deposition method, and the mixed film thus formed is transferred to a second substrate (Patent Document 1).

CITATION LIST

Patent Document

PATENT DOCUMENT 1: Japanese Patent Publication No. 2008-293961

SUMMARY OF THE INVENTION

Technical Problem

However, these methods have the following problems.
(Problems of Vacuum Deposition Method)
In the case of stacking a plurality of layers by the vacuum deposition method, the deposition rate often varies between the layers. Thus, the cycle time of the manufacturing process is limited by the layer having the lowest deposition rate, which is a bottleneck to high productivity.

A resistance heating method in which a crucible is heated for deposition is commonly used in the vacuum deposition method. However, the temperature distribution inside the crucible tends to be uneven, which makes it difficult to maintain a constant deposition rate to accurately control deposition.

Moreover, in order to form a uniform film, an evaporation source need be separated from a substrate by a large distance (TS distance), which unnecessarily increases the size of a vacuum deposition apparatus relative to the substrate size. As a result, a large amount of material is deposited on a portion other than the substrate, which significantly reduces the material utilization efficiency, and increases facility cost.
(Problems of Coating Method)
The coating method is widely used in the field of displays, and for example, a technique of accurately forming a uniform film on a glass substrate of G8 or G10 size has been established. In the organic EL elements, however, a proper stacked structure cannot be formed by the coating method for the following reason. In the organic EL elements, coating need be repeated to stack layers, and a film that has already been stacked dissolves in a solvent contained in a film that is to be stacked, unless the former film is subjected to an insolubilization treatment such as sintering.

In the case of polymer materials, it is possible to repeat coating at various levels of liquid repellency. However, since it is difficult to properly stack all the films, organic EL elements using such materials have degraded characteristics, and thus have not been ready for practical use in terms of life and efficiency.

Moreover, the coating method requires sophisticated control of environmental conditions because water or oxygen entering a film would cause degradation of the material. Thus, a treatment of controlling the atmosphere to a dry or nitrogen atmosphere is performed when forming a film, and a treatment of placing a workpiece under vacuum conditions, a heat treatment, etc. are performed after forming the film in order to remove water etc. Since these treatments are required, manufacturing cost is increased accordingly.
(Problems of Patent Document 1)
Since the first substrate is formed by a vacuum deposition method, Patent Document 1 has the above problems of the vacuum deposition method.

It is an object of the present invention to provide a manufacturing method that is capable of producing, with reduced cycle time and at low cost, an organic EL element having excellent characteristics, and that is preferable for large-size panels.

Solution to the Problem

In order to achieve the above object, according to the present invention, a method for manufacturing an organic EL element including an element substrate, a pair of electrodes comprised of an anode and a cathode and provided over the element substrate, and an organic layer formed between the electrodes and including a light emitting layer that emits light in response to application of a voltage is configured to mainly include: a lower electrode formation step of forming a lower one of the pair of electrodes on the element substrate; a transfer substrate fabrication step of forming a transfer layer by performing a film-forming treatment of forming a film on a donor substrate by using at least one film-forming solution including a stacking material that forms the organic layer, thereby fabricating a transfer substrate; an opposing arrangement step of arranging the transfer substrate and the element substrate so as to face each other with spacers interposed therebetween, such that a surface of the transfer substrate, which has the transfer layer formed thereon, faces the element substrate having the lower electrode formed thereon; a depressurization step of holding the transfer substrate and the element substrate, which face each other, under vacuum conditions; and a transfer step of heating the transfer substrate under the vacuum conditions by a heat source to transfer the transfer layer to the element substrate.

An organic EL element that is manufactured by using the method having the above configuration includes, e.g., the spacers provided on the element substrate, and an equal-thickness layer included in the organic layer and having substantially a same thickness both on the element substrate and on the spacers.

Such an organic EL element is preferable for an organic EL lighting apparatus.

Advantages of the Invention

According to the present invention, a manufacturing method can be provided which is capable of producing an organic EL element with reduced cycle time and at low cost, and which is suitable for larger displays of organic EL elements. Improved material utilization efficiency and a simplified manufacturing apparatus can be implemented, and a reliable organic EL element can be provided.

BRIEF DESCRIPTION OF THE DRAWINGS

FIGS. 10A-10B are illustrations of a treatment of bringing a transfer substrate and the element substrate into close contact with each other by using a pressure bonding apparatus.

FIGS. 12A-12D are illustrations of repetitive multiple transfer.

FIG. 21B is an enlarged view of a main part of FIG. 21A.

FIG. 23A is a plan view and FIG. 23B is a side view.

FIG. 25A is a schematic plan view of a transfer substrate, FIG. 25B is a diagram showing an arrangement of the transfer substrate and an element substrate, and FIG. 25C is a schematic cross-sectional view of the element substrate.

FIG. 26A is a schematic plan view and FIG. 26B is a schematic cross-sectional view.

FIG. 27A is a schematic plan view and FIG. 27B is a schematic cross-sectional view.

FIG. 28A is a schematic plan view and FIG. 28B is a schematic cross-sectional view.

FIG. 29A is a diagram showing a transfer substrate and an element substrate, and FIG. 29B is a schematic cross-sectional view of the element substrate after transfer.

FIG. 30A is a schematic plan view of the heat source, and FIG. 30B is a schematic plan view of an element substrate.

FIG. 31A is a schematic plan view of the heat source, and FIG. 31B is a schematic plan view of an element substrate.

FIG. 34 is a diagram showing chemical formulae of main materials.

DESCRIPTION OF EMBODIMENTS

Figure 1:
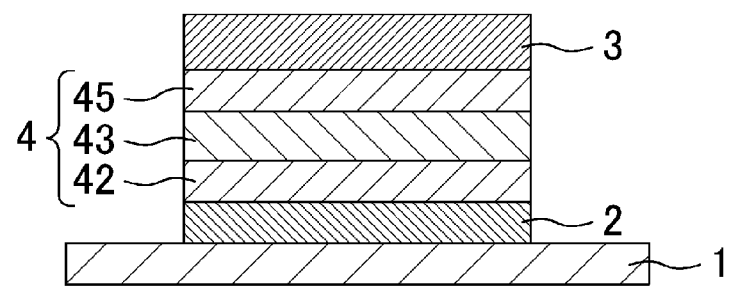
FIG. 1 is a schematic view showing a structure of an organic EL element according to an embodiment.

An embodiment of the present invention will be described in detail below with reference to the accompanying drawings. The following description is by way of illustration only, and is not intended to limit the present invention, and its applications or uses. Note that common members are denoted with the same reference characters throughout the figures unless otherwise mentioned.

Outline of Embodiment

FIG. 1 is a schematic view showing a structure of an organic EL element in the present embodiment. This organic EL element includes, over an element substrate 1, a pair of electrodes formed by an anode 2 and a cathode 3, and an organic layer 4 provided between the electrodes 2, 3 and including a light emitting layer 43 that emits light in response to application of a voltage. Note that in the figure, reference character "42" represents a hole transport layer, and reference character "45" represents an electron injection layer.

FIGS. 2A-2D show an outline of a method for manufacturing the organic EL element in the present embodiment. In FIGS. 2A-2D, reference character "10" represents a donor substrate, reference character "11" represents a transfer layer, reference character "12" represents a transfer substrate, reference character "13" represents a spacer, reference character "14" represents a vacuum chamber, and reference character "15" represents a heat source. A transfer substrate 12 that is fabricated by using the donor substrate 10 is used as an auxiliary substrate during manufacturing. A vacuum chamber 14 is an apparatus capable of depressurizing the chamber to high vacuum. A heat source 15 is formed in the shape of a flat plate, and is placed on an inner wall surface of the vacuum chamber 14 so that the surface of the heat source 15 emitting thermal energy faces inward.

This manufacturing method includes the following steps.

<Lower Electrode Formation Step> A lower electrode (the anode 2) is formed on the element substrate 1.

<Transfer Substrate Fabrication Step> By using a film-forming solution containing a stacking material that forms the organic layer 4, a film-forming treatment of forming a film on the donor substrate 10 is performed to form a transfer layer 11, thereby fabricating the transfer substrate 12. In this manufacturing method, the transfer layer 11 is normally formed on substantially the entire surface of the donor substrate 10.

<Opposing Arrangement Step> The transfer substrate 12 and the element substrate 1 are placed so as to face each other with spacers 13 interposed therebetween, such that the surface of the transfer substrate 12, which has the transfer layer 11 formed thereon, faces the element substrate 1 having the lower electrode formed thereon.

<Depressurization Step> The transfer substrate 12 and the element substrate 1 facing each other are held under vacuum conditions.

<Transfer Step> The transfer substrate 12 is heated by the heat source 15 under the vacuum conditions to transfer the transfer layer 11 to the element substrate 1.

Figure 2A:
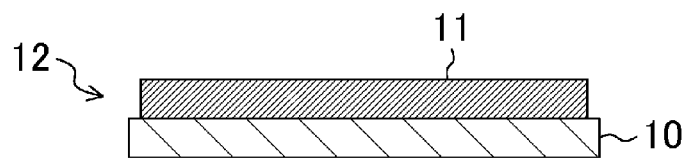
FIGS. 2A-2D are schematic diagrams illustrating main steps of a method for manufacturing the organic EL element according to the embodiment.

Specifically, as shown in FIG. 2A, a stacking material is formed on the entire surface of the donor substrate 10 to fabricate the transfer substrate 12 having the transfer layer 11 formed thereon. The spacers 13 are provided in advance on the element substrate 1. Note that the spacers 13 may be provided on the transfer substrate 12.

Figure 2B:
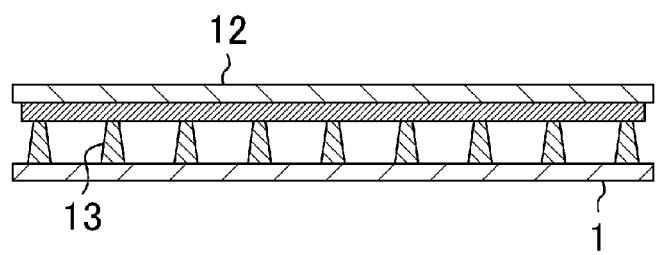
Figure 2C:
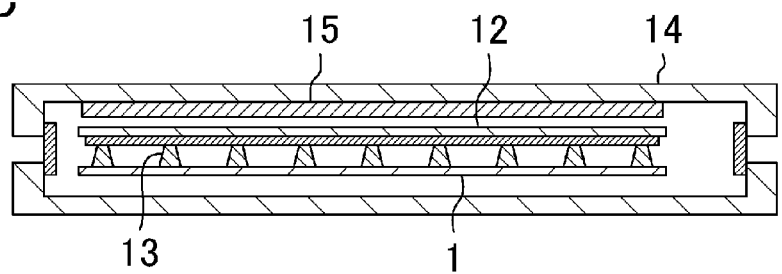

Then, as shown in FIG. 2B, the element substrate 1 and the transfer substrate 12 are placed so as to face each other. At this time, alignment is performed as required. Thereafter, as shown in FIG. 2C, the substrates 1, 12 placed to face each other are held under vacuum conditions by using the vacuum chamber 14.

Figure 2D:
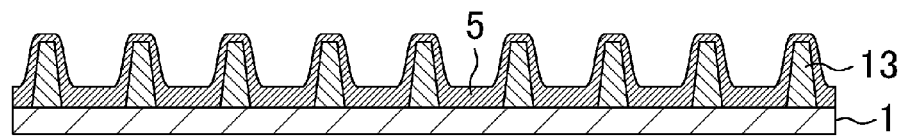

Then, the heat source 15 is heated, whereby the transfer layer 11 is sublimated and transferred to the element substrate 1. Thus, as shown in FIG. 2D, an organic film 5 comprised of the stacking material can be formed on the entire surface of a predetermined area of the element substrate 1 in a relatively short time. In order to form a high-quality organic film 5, it is important to maintain a uniform small gap (TS distance) between the transfer substrate 12 and the element substrate 1 by the spacers 13.

As described above, in this manufacturing method, thermal vapor deposition is performed at a very short TS distance by using the gap between the element substrate 1 and the transfer substrate 12. Thus, according to the manufacturing method, the conventional problem can be reduced, namely the material utilization efficiency can be improved, while using the advantages of the vacuum deposition method.

Moreover, since the stacking material need only be formed in advance on the donor substrate 10 by a coating method etc., shorter cycle time and lower cost can be implemented. Moreover, impurities such as oxygen or water that have entered the film during formation of the film are removed in the depressurization step and the transfer step, performance can also be improved.

<Specific Configuration of Embodiment>

A specific configuration of the manufacturing method will be described below.

It is preferable that the "transfer substrate fabrication step be performed under atmospheric pressure conditions." Since materials of the light emitting layer 43, the hole transport layer 42, etc. forming the organic EL element tend to be degraded by oxygen or water, it is essentially not preferable to form a film by using a wet coating method etc. under the atmospheric pressure. However, according to the manufacturing method of the present embodiment, oxygen etc. is removed in the depressurization step and the transfer step that are performed later. Thus, the transfer substrate 12 can be fabricated under the atmospheric pressure, thereby facilitating fabrication.

It is preferable that the "transfer substrate fabrication step be performed under such conditions that a dew-point temperature is $-20°$ C. or less." This is because performing this step in a dry atmosphere (dry air) allows water to be more effectively removed. The dew-point temperature higher than $-20°$ C. may destabilize the dry atmosphere. Dry air having a dew-point temperature of about $-20°$ C. can be produced by using existing pneumatic apparatuses, whereby manufacturing cost can be reduced.

Since the stacking material is transferred under vacuum conditions, a film equivalent to that of a conventional vacuum deposition method can be formed. Since a very short TS distance is maintained by the spacers 13, uniform deposition can be achieved under stable deposition conditions, and almost all of the stacking material can be transferred to the element substrate 1. Thus, the material utilization efficiency of this manufacturing method is further improved over the coating method having high material utilization efficiency.

It is preferable that the "transfer step be performed under such conditions that a degree of vacuum is $1\times10^{-3}$ Pa or less." Performing the transfer step under high vacuum conditions with a degree of vacuum at $10^{-3}$ Pa or less can reduce the heating temperature required to sublimate the stacking material, and can reduce thermal degradation of the stacking material. Note that performing the transfer step under low vacuum having a degree of vacuum higher than $10^{-3}$ Pa may cause thermal degradation of the stacking material.

It is preferable that the "transfer layer 11 be comprised of a low molecular organic material (also referred to as the 'low molecular material')." That is, the low molecular organic material is used as the stacking material. Low molecular materials are commonly used in organic EL elements, and a vacuum deposition method is typically used to stack such a low molecular material. A coating method etc. is essentially more desirable in view of convenience of the manufacturing process and cost for apparatuses. However, since many of the low molecular materials do not have a sufficient self-supporting property, it is difficult to form a high quality film by the coating method etc.

In the present embodiment, a uniform organic film 5 can be formed on the element substrate 1 by sublimation during deposition. Thus, a high quality film need not be formed on the donor substrate 10, and a film need only be formed in a predetermined area as an evaporation source. That is, although a film of the low molecular material can be formed only by the vapor deposition method in conventional examples, such a film of the low molecular material can be formed with high material utilization efficiency in the present embodiment.

Moreover, one problem in terms of manufacturing is that in the vacuum deposition method using the low molecular material, the deposition rate varies depending on the kind of low molecular material. On the other hand, in this manufacturing method, high-speed transfer can be achieved by appropriately performing a heating method using the heat source 15. A manufacturing method that has generally hardly affected by the difference in deposition rate and has reduced cycle time can be implemented by the present embodiment.

It is preferable that the "donor substrate 10 be comprised of a material that allows thermal energy emitted from the heat source 15 to pass therethrough." This can prevent loss of the thermal energy in the donor substrate.

Figure 22A:
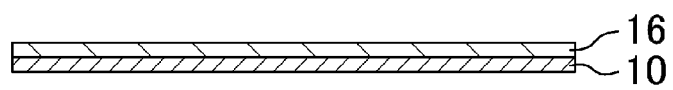
FIGS. 22A-22G are schematic views illustrating main steps of a manufacturing method of the organic EL element of the first example.
Figure 22B:
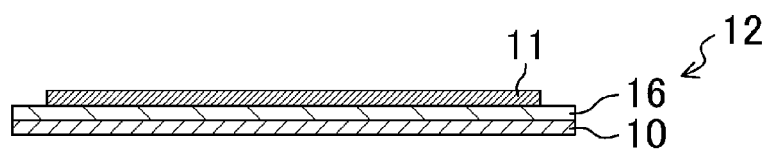

In this case, it is preferable that a "heat generating layer 16 that absorbs the thermal energy be provided on the surface of the donor substrate 10 on which the transfer layer 11 is formed" (see, e.g., FIG. 22B).

Although infrared light can directly heat the transfer layer 11, visible light is often advantageous in view of the substrate size, the cost of the heat source, etc. In this case, since the absorption wavelength varies depending on the kind of stacking material, the wavelength of the heat source need be changed in order to efficiently perform heating. Thus, the heat generating layer 16 that absorbs the thermal energy is provided so that the transfer layer can be heated by the heat of the heat generating layer 16. In this manner, heating can be efficiently performed regardless of the kind of stacking material 6.

The "donor substrate 10 may be comprised of a material (a heat absorbing material) that absorbs the thermal energy emitted from the heat source 15." In this case, since the donor substrate 10 functions as the heat generating layer 16 as well, the configuration can be simplified. Depending on the type of heat source 15, the donor substrate 10 may be in a form such as a metal plate or a band-shaped metal sheet capable of being wound up into a roll, although the present invention is not limited to these forms.

It is preferable that the "spacers 13 be provided on the element substrate 1." If the spacers 13 are provided on the donor substrate 10 and transfer of the transfer layer 11 is performed a plurality of times in order to form a stack, the spacers 13 tend to be misaligned with respect to the element substrate 1 in each transfer. If such a misalignment occurs, the transfer area varies in every transfer. Thus, the transfer layer 11 may be unnecessarily transferred to a portion other than the predetermined transfer area in the case of, e.g., a high-definition pixel size.

By providing the spacers 13 on the element substrate 1, the transfer layer 11 can be transferred to the predetermined area in every transfer even if the transfer is performed a plurality of times. Thus, stacking accuracy of the organic EL element can be improved.

The "spacers 13 may be provided on the donor substrate 10." Depending on the pixel size and the specifications, it may not cause any problem even if the transfer layer 11 is transferred to a portion other than the predetermined area. For example, in the case where the pixel size is relatively large such as in large televisions (TVs), a small misalignment does not affect the quality.

Thus, the spacers 13 can be formed on the donor substrate 10 in such a case. In the case of forming the spacers 13 on the element substrate 1, the spacers 13 need be formed on all the element substrates 1. However, in the case of forming the spacers 13 on the donor substrate 10, the number of spacers 13 can be significantly reduced because the donor substrate 10 can be repeatedly used. Since the number of spacers 13 is reduced, the material cost and the manufacturing cost can also be reduced accordingly.

Figure 3:
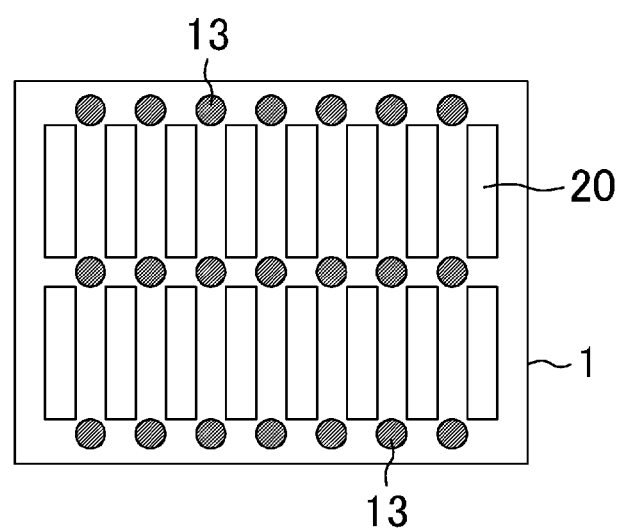
FIG. 3 is a schematic plan view showing a form of spacers.

The "spacers 13 may be formed in a pillar shape." FIG. 3 shows a specific example. In the figure, reference character "20" represents a pixel electrode (the anode 2). Thus, in the case where a display etc. is formed by the organic EL element, the lower electrode formation step sometimes includes a treatment of patterning an electrode material into a grid shape to form a plurality of pixel electrodes 20 as the lower electrode.

In this specific example, the spacers 13 are formed in a columnar shape, and each spacer 13 is placed in a region between adjoining corners of the pixel electrodes 20 in the element substrate 1. The spacers 13 are formed outside the area where the pixel electrodes 20 are formed. Forming the spacers 13 in a pillar shape can reduce the area of the spacers 13 as viewed in plan, whereby the impact of a misalignment between the element substrate 1 and the transfer substrate 12 can be reduced. The arrangement of the spacers 13 can be appropriately designed as required. However, a constant TS distance can be easily maintained in the arrangement of FIG. 3, because the spacers 13 can be arranged in a well-balanced manner. The spacers 13 are not limited to the columnar shape, and may be in the shape of a rectangular prism, a polygonal prism, etc.

Figure 4:
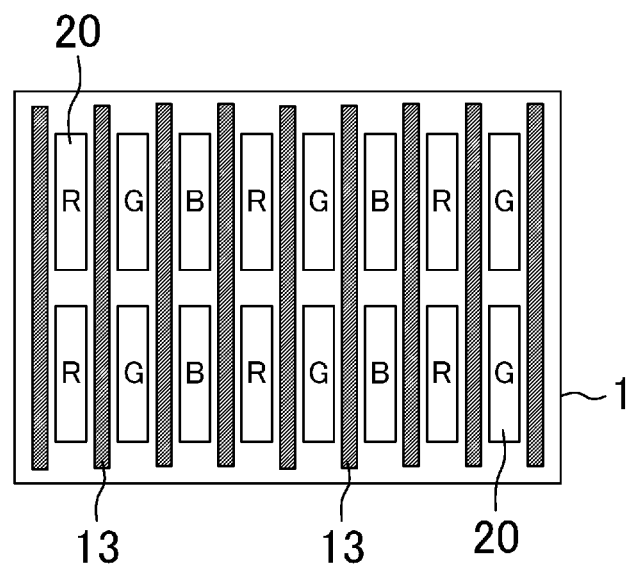
FIG. 4 is a schematic plan view illustrating an arrangement of the spacers.

As shown in FIG. 4, the "spacers 13 may be arranged in a stripe pattern." This figure shows an example of the element substrate 1 having the plurality of pixel electrodes 20 arranged so as to correspond to sub-pixels of red (R), green (G), and blue (B) for color displays.

Thus, sub-pixels of each color are arranged in a stripe pattern in some color displays. In this case, although it is also important for the element substrate 1 to have a uniform film thickness on its entire surface, it is particularly important for the element substrate 1 to have a uniform film thickness in each area of the stripe pattern defined by the spacers 13. An optimal thickness of the sub pixels may vary depending on the color (RGB), and in that case, the sub-pixels of each color need be formed with their own optimal thickness.

Thus, by arranging the plurality of linear spacers 13 in a stripe pattern, a layer having a uniform thickness can be formed in each area defined by the spacers 13.

Figure 5:
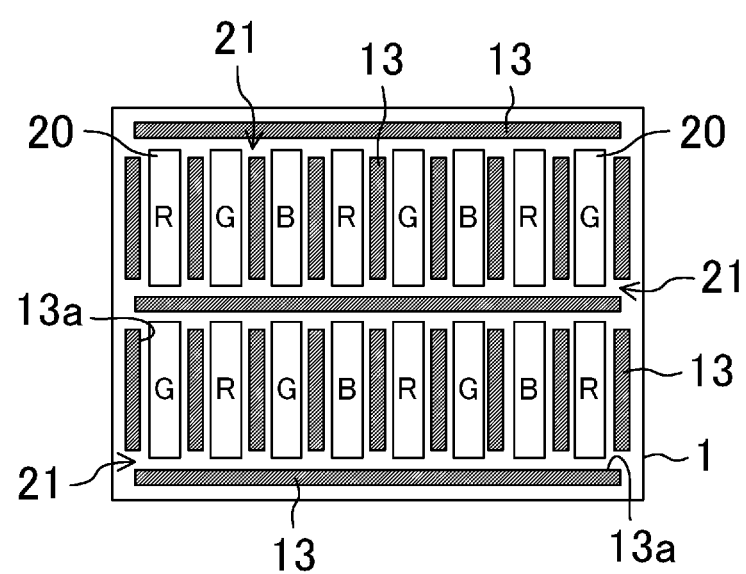
FIG. 5 is a schematic plan view illustrating an arrangement of the spacers.

As shown in FIG. 5, the "spacers 13 may be arranged so as to surround each of the plurality of pixel electrodes 20, and openings 21 may be formed in surrounding surfaces 13a of the spacers 13 surrounding each of the pixel electrodes 20." As used herein, the surrounding surface 13a of the spacer 13 refers to a side surface of the spacer 13 extending substantially perpendicularly to the element substrate 1 and surrounding a corresponding one of the pixel electrodes 20.

Thus, the sub-pixels of RGB are arranged in a delta pattern in some color displays. In this case, in order to ensure the optimal thickness of the sub-pixels of each color, the sub-pixels need be formed on a color-by-color basis. By surrounding each pixel electrode 20 by the spacers 13 in this manner, a layer of the sub-pixels having a uniform thickness can be formed on a color-by-color basis.

In this manufacturing method, depressurization is sometimes performed with the transfer substrate 12 and the element substrate 1 bonded together. In this case, if each pixel electrode 20 is entirely surrounded by the spacers 13, the region inside each pixel electrode 20 is hermetically sealed, and cannot be depressurized. Thus, the openings 21 communicating with the outside are formed in the surrounding surfaces 13a of the spacers 13 surrounding each pixel electrode 20, so that depressurization can be performed.

Figure 6:
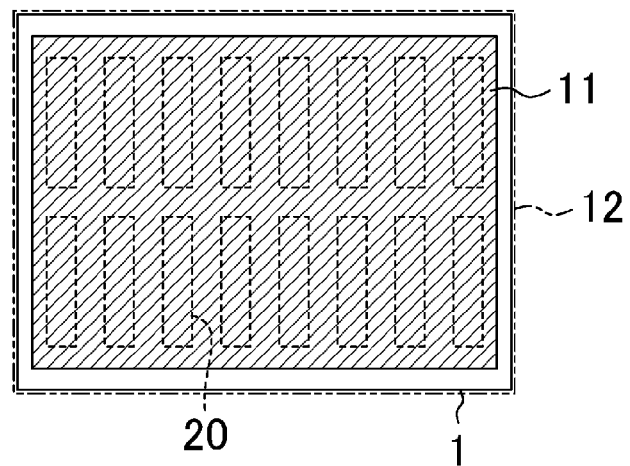
FIG. 6 is a schematic plan view showing a form of a transfer layer.

It is preferable that the "transfer layer 11 be formed on substantially the entire surface of the donor substrate 10 so as to correspond to an area where the organic film 4 is to be formed." FIG. 6 shows a specific example. In this specific example, the transfer layer 11 is formed by coating with a film-forming solution the entire surface of the area of the donor substrate 10 which substantially corresponds to the area where the organic film 4 is to be formed on the element substrate 1. Examples of the coating method include versatile methods such as a spin coating method, a spray method, a dipping method, a slit coating method, etc. Note that the hatched region in FIG. 6 represents the transfer layer 11.

Figure 7:
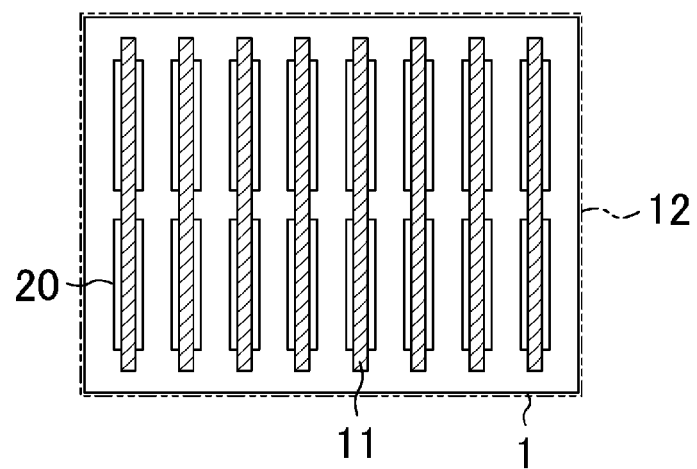
FIG. 7 is a schematic plan view showing a form of transfer layers.

As shown in FIG. 7, the "transfer layer 11 may be formed in a stripe pattern."

In this manufacturing method, a stacking material is sublimated and transferred to the element substrate 1 that is separated from the transfer substrate 12 by the TS distance. At this time, the stacking material normally diffuses between the transfer substrate 12 and the element substrate 1 with no directionality. However, if the TS distance is increased without making the transfer substrate 12 and the element substrate 1 in close contact with each other, the stacking material adheres to the element substrate 1 with directionality as in the vacuum deposition method, and a film tends to be formed in the area facing the transfer layer 11 on the element substrate 1.

Since the film can be intensively formed in a predetermined area of the element substrate, a thick film can be formed on the element substrate 1 from a small amount of stacking material. That is, the amount of stacking material that adheres to the spacers 13 etc. is reduced, whereby the material utilization efficiency can be increased accordingly.

Specifically, as shown in FIG. 7, linear or band-shaped transfer layers 11 can be formed to extend along the centers of the widths of the plurality of pixel electrodes 20 arranged in a stripe pattern, as viewed in plan.

Figure 8:
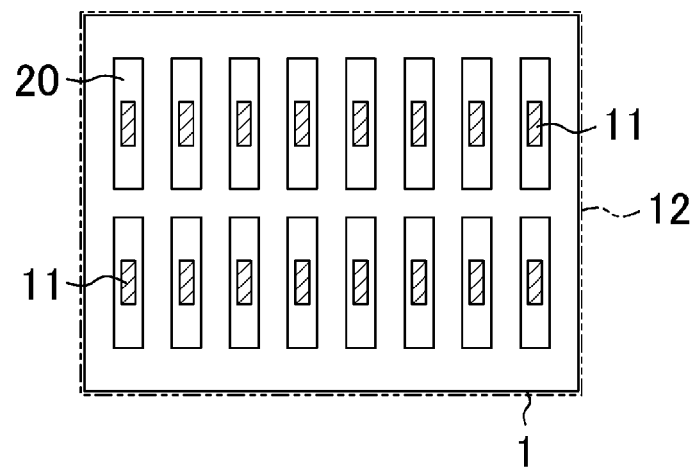
FIG. 8 is a schematic plan view showing a form of transfer layers.

Alternatively, as shown in FIG. 8, the "transfer layers 11 can be respectively formed so as to be located inside the areas corresponding to the pixel electrodes 20, as viewed in plan." In this case, the "transfer layers 11 can be formed in a spot shape at at least one position in each of the areas corresponding to the pixel electrodes 20."

In the case of forming a film on each electrode pixel 20, if the transfer layers 11 are respectively formed inside the areas corresponding to the pixel electrodes 20, the film can be efficiently formed on each pixel electrode 20 by adjusting the TS distance. In particular, more efficient formation of the film can be expected by forming the transfer layers 11 in a spot shape. An example of a method for forming the transfer layers 11 in a stripe pattern or a spot shape include a known inkjet method (which is also referred to as the "IJ method") etc.

It is preferable that "in the transfer substrate fabrication step, the transfer layer 11 be formed to have a film-like structure in which fine particles are continuously bonded together." As described above, since the stacking material is sublimated in the transfer step, the low molecular material can be used as the stacking material for forming a film. However, if the transfer layer 11 is extremely non-uniform due to a very short TS distance, the transfer layer 11 may affect the form of the transferred film.

However, if the transfer layer 11 is formed to have the film-like structure in which fine particles are continuously bonded together (which is also referred to as the "fine-particle bond film"), formation of an extremely non-uniform transfer layer 11 can be prevented. That is, the fine particles continuously bonded together reduce the possibility of formation of an extremely non-uniform film. Variation in sublimation of the transfer layer 11 is also reduced, whereby the transfer layer 11 can be uniformly transferred.

For example, a "small droplet spray method in which the film-forming solution is divided into droplets and sprayed can be used" as a method for forming such a fine-particle bond film.

In this case, the droplets that are sprayed preferably have a mean particle size of 10 μm or less, and more preferably 1 μm or less. The smaller the droplets are, the more the surface area increases relatively. Thus, the droplets become dry as soon as they reach the donor substrate 10, whereby a satisfactory fine-particle bond film can be formed.

Specifically, the droplets may be sprayed by using a spray. In particular, the droplets that are sprayed may be electrically charged (an electrospray method). Thus, the droplets are further divided into smaller droplets by an electrostatic force, whereby very small, uniform droplets can be stably formed.

It is preferable that "in the transfer substrate fabrication step, a low boiling-point material is used as a solvent of the film-forming solution." The stacking material is formed on the donor substrate 10 by coating etc. At this time, a heat treatment is normally performed to remove oxygen or water contained in the film-forming solution. However, this heat treatment may reduce the quality of the stacking material. For example, performing the heat treatment by using a glove box etc. capable of removing oxygen etc. to a large degree can prevent such reduction in quality of the stacking material, but increases facility cost.

Thus, by using the low boiling-point solvent as the solvent, the solvent can be naturally removed in the course of coating. This eliminates the need for a drying treatment, or requires only a relatively weak drying treatment. Note that as used herein, the term "low boiling point" means a boiling point of, e.g., 120° C. or less. A solvent having a boiling point of 120° C. or less can be dried substantially simultaneously with completion of the coating, eliminating the need for the drying treatment.

In particular, it is effective to combine the low boiling-point solvent with the small droplet spray method. This further facilitates drying, whereby reduction in quality of the stacking material can be suppressed, and the manufacturing cost can be reduced.

"In the transfer substrate fabrication step, a treatment of heating the donor substrate 10 may be performed while the transfer layer 11 is being formed." Since the transfer substrate 12 is held under vacuum conditions in the subsequent depressurization step, it is preferable to remove the solvent as much as possible by the time the depressurization step is performed. Thus, the solvent can be efficiently removed by heating the donor substrate 10 while performing coating. Performing the heat treatment simultaneously with the coating eliminates the need to perform the heat treatment separately, whereby the number of manufacturing facilities and the number of manufacturing steps can be reduced.

"In the transfer substrate fabrication step, the film-forming solution can be produced by dispersing the stacking material in a solvent." A low molecular material having light emitting characteristics and a charge transport property is mainly used as the stacking material. This manufacturing method uses the film-forming solution to fabricate the transfer substrate 12. However, some stacking materials have significantly low solubility in the solvent, or characteristics of some stacking materials are degraded if the stacking materials are provided with solubility in the solvent. Thus, in the case of using such a stacking material, the stacking material need only be dispersed in the film-forming solution. This is because the transfer layer 11 need only function as an evaporation source, and need not be formed with high accuracy.

Examples of a method for preparing such a dispersion include a homogenizer using ultrasonic vibrations, a paint shaker, a bead mill, and a shear dispersion method, and an appropriate method may be used according to the kind of stacking material. Note that dispersibility is preferably 10 μm or less as primary particles, and is more preferably 1 μm or less in view of uniform diffusivity and a film-forming property at the time of transfer.

In this case, the "film-forming solution may contain an additive that enhances dispersibility of the stacking material." Agglomeration of the stacking material significantly degrades the film-forming property. Thus, adding the additive that enhances the dispersibility of the stacking material can prevent agglomeration of the stacking material.

Moreover, in this case, it is preferable that "a treatment of thermally decomposing the additive be performed in the transfer substrate fabrication step." If the additive remains in the transfer layer 11, this additive may adversely affect light emission characteristics and electrical characteristics of the organic layer 4 that is to be formed subsequently. Thus, such an adverse effect of the additive can be prevented by decomposing the additive by heating that is performed by the drying treatment. In this case, it is preferable to use an additive that is decomposed at a temperature used to perform the treatment of drying the solvent.

It is preferable that "in the depressurization step, a treatment of forming a hermetically sealed space between the transfer substrate 12 and the element substrate 1 be performed, and a pressure inside the hermetically sealed space be adjusted so as to be lower than that outside the hermetically sealed space." In other words, the pressure is adjusted so as to satisfy "Pa> Pb," where "Pa" represents the pressure outside the hermetically sealed space, and "Pb" represents the pressure inside the hermetically sealed space.

The transfer treatment is performed under vacuum conditions in the state in which the transfer substrate 12 faces the element substrate 1 with the spacers 13 therebetween. At this time, both substrates need be held at a constant TS distance from each other. In order to hold the substrates in this manner, it is preferable to press the substrates so that the entire surfaces of the substrates uniformly closely contact each other. Thus, the pressure inside the hermetically sealed space formed between the substrates is adjusted so as to be lower than that outside the hermetically sealed space, whereby the substrates are pressed by the pressure difference in such a direction that the substrates are brought into contact with each other.

Figure 9:
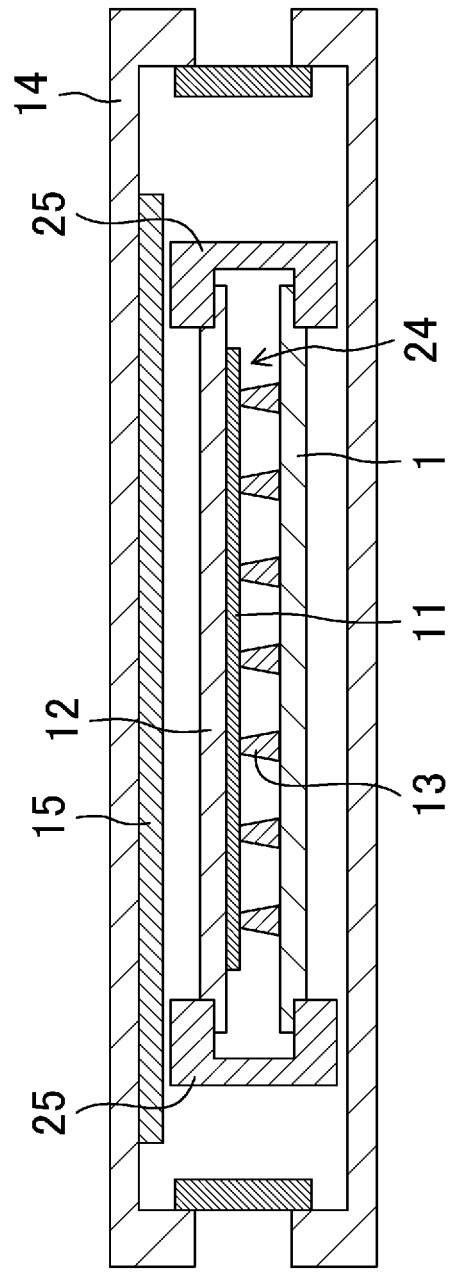
FIG. 9 is a conceptual diagram showing a state in which an element substrate etc. has been placed in a vacuum chamber.

FIG. 9 shows a specific example. In the figure, reference character "24" represents a hermetically sealed space, and reference character "25" represents a chuck. First, the transfer substrate 12 and the element substrate 1 are bonded together so as to face each other in the vacuum chamber 14. In this state, the vacuum chamber 14 is depressurized to maintain a degree of vacuum of $1\times10^{-3}$ Pa. At this time, the space between the substrates 1, 12 has not been hermetically sealed. Thus, the space between the substrates 1, 12 has the same degree of vacuum as that in the vacuum chamber 14, which is $1\times10^{-3}$ Pa.

In this state, the ends of both substrates are held and sealed by the chuck 25, thereby forming a hermetically sealed space 24 between the substrates 1, 12. Thereafter, the degree of vacuum in the vacuum chamber 14 is reduced. Since the degree of vacuum in the hermetically sealed space 24 is maintained, reducing the degree of vacuum in the vacuum chamber 14 relatively reduces the pressure in the hermetically sealed space 24 accordingly, whereby the substrates 1, 12 are pressed in such a direction that the substrates 1, 12 are brought into contact with each other. Since the pressure is uniformly applied to both substrates 1, 12, a uniform TS distance can be maintained between the entire surfaces of the substrates 1, 12.

In addition to the pressure adjustment, a "treatment of physically bringing the transfer substrate 12 and the element substrate 1 into close contact with each other may be performed by a pressure bonding apparatus."

FIGS. 10A-10B show a specific example. In these figures, reference character "26" represents an extendable frame capable of being elastically deformed, and reference character "27" represents a pressure bonding apparatus for pressing. The pressure bonding apparatus 27 includes a base 27a that is attached to the bottom of the vacuum chamber 14, and a plate-like platform 27c located above the base 27a and attached to the base 27a via extendable legs 27b so as to face the base 27a. The platform 27c can be moved up and down.

In this case, if the transfer substrate 12 etc. is placed on the platform 27c as shown in FIG. 10A and the platform 27c is lifted, the transfer substrate 12 is brought into close contact with the heat source 15 as shown in FIG. 10B. The transfer substrate 12 can be made to firmly and closely contact the element substrate 1 by further lifting the platform 27c. The TS distance is adjusted by the extendable frame 26.

In this manner, a constant TS distance can also be maintained between the substrates by physically applying an external force between the transfer substrate 12 and the element substrate 1.

It is preferable that the "transfer substrate 12 include the heat generating layer 16, a light emitting apparatus be used as the heat source 15, and the heat generating layer 16 generate heat by absorbing light that is emitted from the light emitting apparatus." That is, light is emitted from the light emitting apparatus as the heat source 15 toward the transfer substrate 12. Thus, the heat generating layer 16 absorbs the light to generate heat, whereby the heat can be efficiently transmitted to the transfer layer 11 regardless of the type of stacking material. In particular, the light emitted from the light emitting apparatus is preferably visible light. This is because the area can be easily increased when the organic EL element is increased in size.

A "light emitting apparatus that emits infrared light may be used as the heat source 15." Since infrared light can directly heat the stacking material, the stacking material can be efficiently transferred. The heat generating layer 16 is not required if the donor substrate 10 is comprised of a material that allows infrared light to pass therethrough. Although examples of this type of light emitting apparatus include a halogen lamp and a xenon lamp, the light emitting apparatus is not limited to these. A filter that allows only infrared light to pass therethrough may be installed.

The "heat source 15 may emit pulsed radiation of thermal energy." Continuous irradiation of thermal energy may excessively increase the temperature, and may adversely affect the element substrate 1, the organic layer 4, etc. On the other hand, pulsed irradiation of thermal energy can prevent an excessive increase in temperature. Since radiation is intermittently emitted only for a very short time, the thermal energy is not transmitted to a deep portion, whereby an increase in temperature of the element substrate 1 etc. located farther beyond the transfer substrate 12 can be suppressed.

Since the temperature decreases in a very short time, control is facilitated, and excessive heating can be prevented. Moreover, if the thermal energy is continuously radiated with the pulse time being reduced until a change in volume of the transfer layer 11 due to heat can no longer follow the pulse time, expansion energy is accumulated in the transfer layer 11, whereby the transfer efficiency can be increased.

The pulsed irradiation time is preferably, e.g., 100 msec or less, and is more preferably 1 μsec or less in order to increase the transfer efficiency. This can effectively prevent heat accumulation. In order to perform transfer by using expansion energy, the pulsed irradiation time is preferably 100 psec or less, and more preferably 100 fsec or less.

Oscillations of the pulsed irradiation may be obtained by oscillating radiated light itself, or may be mechanically obtained by using a shutter.

"In the transfer step, at least two different regions of the transfer substrate 12 may be heated by the heat source 12 to perform transfer a plurality of times" (multiple transfer). Transfer can be completed by single transfer by using the heat source 15 having about the same size as that of the transfer substrate 12. However, if the size is increased, an extensive treatment is required. Thus, transfer can be efficiently performed by dividing the transfer area into a plurality of regions, and conducting irradiation a plurality of times. FIGS. 11A-11B and 12A-12D show specific examples.

Figure 11A:
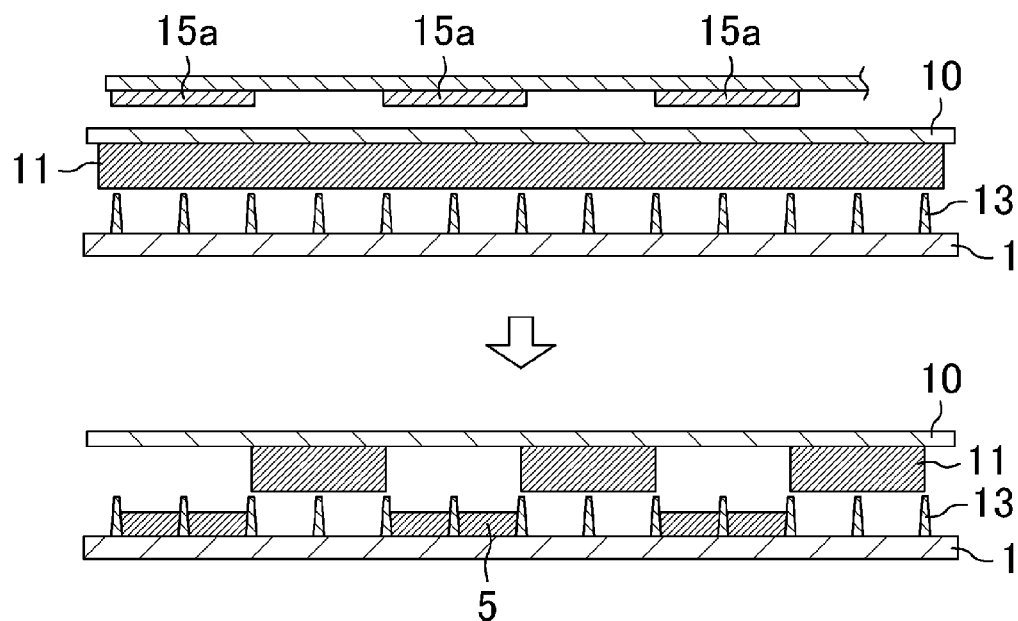
FIGS. 11A-11B are illustrations of multiple transfer.
Figure 11B:
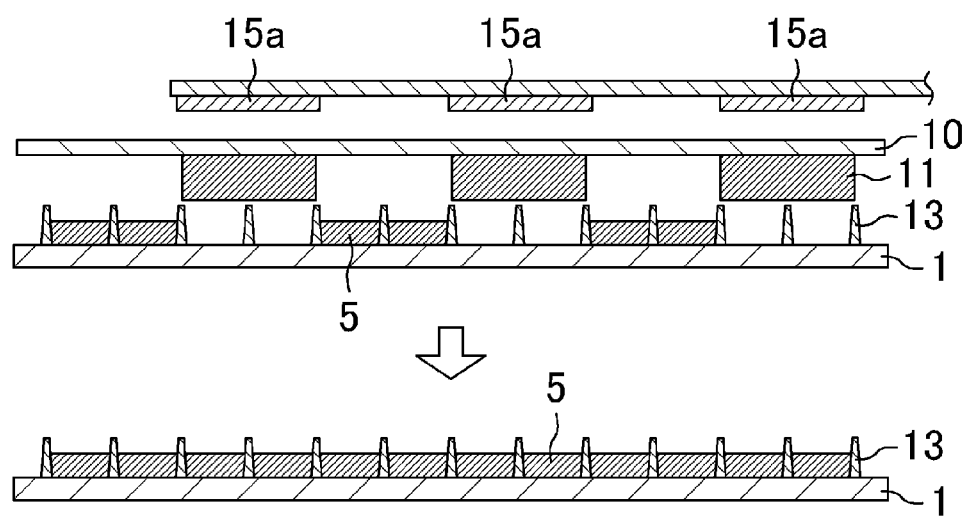

FIGS. 11A-11B show an example in which transfer is performed two times. Specifically, the heat source 15 is formed by a plurality of band-shaped element heat sources 15a arranged in a stripe pattern. The area where each element heat source 15a is provided is designed to have the same width as that of the area of the gap between adjoining ones of the element heat sources 15a. Each element heat source 15a is designed to have substantially the same length dimension as that of the transfer substrate 12.

First, in a first step, the element heat sources 15a are placed, and transfer is performed, as shown in FIG. 11A. Thus, those portions of the transfer layer 11 facing the element heat sources 15a are transferred to the element substrate 1, whereas those portions of the transfer layer 11 facing the gaps are not transferred to the element substrate 1.

Next, as a second step, the element heat sources 15a are moved to the positions corresponding to the gaps, as shown in FIG. 11B. In this state, transfer is performed again, whereby the remaining transfer layer 11 can be transferred to the element substrate 1.

In this example, the transfer area is divided into a plurality of regions, and transfer is performed a plurality of times, whereby the transfer layer 11 can be efficiently transferred to the entire surface of the element substrate 1. Although the transfer area is divided into two regions in the above example, the present invention is not limited to this, and the transfer area may be divided into three or more regions.

FIGS. 12A-12D show an example of repetitive transfer, in which transfer is performed two times in each region while moving the heat source 15. Specifically, the heat source 15 is formed in a band shape. The heat source 15 is designed to have substantially the same length dimension as that of the transfer substrate 12.

First, in a first step, as shown in FIG. 11A, transfer is performed while moving the heat source 15 from an end of the transfer substrate 12 in the lateral direction by a predetermined interval at a time. At this time, the amount of heating by the heat source 15 is adjusted so that only part of the transfer layer 11 is transferred. Thus, in each region where transfer has been performed, part of the transfer layer 11 has been transferred to the element substrate 1, whereas the remaining part of the transfer layer 11 remains on the donor substrate 10 without being transferred.

Next, in a second step, as shown in FIG. 12B, transfer is performed in a manner similar to that of the first step in those regions where transfer has not been performed. Thus, in each of these regions as well, part of the transfer layer 11 is transferred to the element substrate 1, whereby a film having a uniform thickness is formed over the entire surface of the element substrate 1.

Moreover, in a third step, as shown in FIG. 12C, transfer is performed again in a manner similar to that of FIG. 12A to transfer the entire transfer layer 11 left by the first step. Furthermore, in a fourth step, as shown in FIG. 12D, transfer is performed again in a manner similar to that of FIG. 12B to transfer the entire transfer layer 11 left by the second step.

Thus, even if the transfer area is divided into a plurality of regions, and the amount of transfer layer 11 to be transferred by each transfer in each region is reduced so that transfer is performed a plurality of times in each region, the transfer layer 11 can be efficiently transferred to the entire surface of the element substrate 1. In this example, half of the transfer layer 11 is transferred by each transfer in each region. However, the present invention is not limited to this, and one third or less of the transfer layer 11 may be transferred by each transfer in each region.

The spacers 13 can be arranged in various patterns as appropriate.

For example, a "substrate with spacers can be formed by providing the spacers 13 on at least one of the transfer substrate 12 and the element substrate 1, a plurality of surrounding portions defined by the spacers 13 can be formed on one primary surface of the substrate with spacers, openings 21 can be formed in the surrounding surfaces 13a of the spacers 13 respectively surrounding the plurality of surrounding portions, the plurality of surrounding portions can communicate with each other via the openings 21, and at least one of the openings 21 can be placed at an end of the substrate with spacers so as to serve as an air outlet."

FIGS. 13A-17B show specific examples. In the figures, reference character "22" represents a surrounding portion. Although the spacers 13 may be provided on the transfer substrate 12, the spacers 13 are provided on the element substrate 1 (the substrate with spacers) in each of the examples. The element substrate 1 is bonded with the transfer substrate 12, whereby a plurality of spaces defined by the surrounding surfaces 13a of the spacers 13 are formed between the substrates.

Figure 13A:
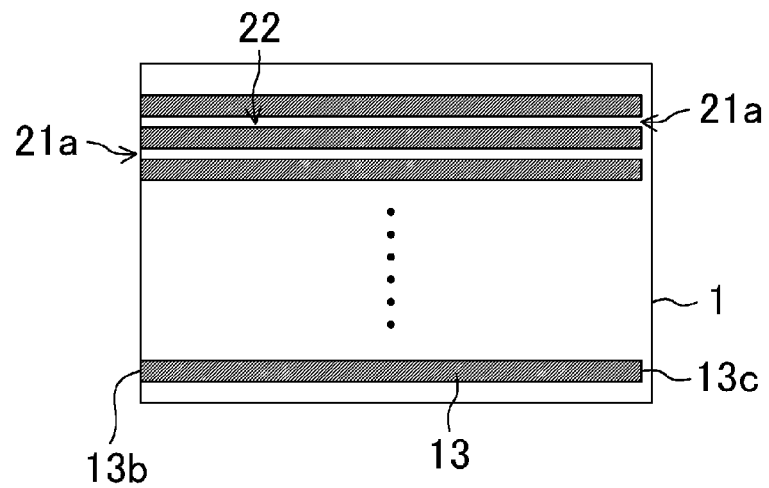
FIG. 13A is a schematic plan view showing a form of the spacers.
Figure 13B:
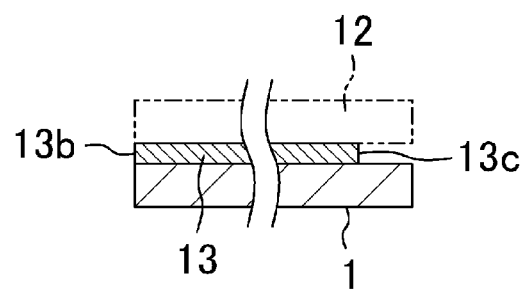
FIG. 13B is a cross-sectional view showing both ends of FIG. 13A.

In FIGS. 13A-13B, the spacers 13 are formed in a linear shape, and are arranged parallel to each other in a stripe pattern. One end 13b of each spacer 13 extends to the edge of one side (the left side in the figures) of the element substrate 1. The other end 13c of each spacer 13 extends to a position close to the edge of the other side (the right side in the figures) of the element substrate 1.

In this example, the spacers 13 are arranged in a stripe pattern, and the spacers 13 do not extend to the edge of the element substrate 1 as shown on the right side of FIG. 13B. In this case, if a load is applied, the openings 21 may be narrowed because the end of the element substrate 1 become closer to the end of the transfer substrate 12, or the openings 21 may be closed because the respective ends of the substrates 1, 12 contact each other. This makes it difficult to remove air from the space between the substrates at the time of depressurization. Thus, by extending the ends of the spacers 13 to the edges of the element substrate 1, the openings 21 (air outlets 21a) through which air is removed can be secured at the ends of the substrates 1, 12, whereby air can be removed from the space between the substrates without difficulty.

It should be understood that the ends of the spacers 13 need not necessarily extend to the edges of the element substrate 1 if the air outlets 21a can be secured. It is preferable that the distance by which the ends of the spacers 13 are located inside the edge of the element substrate 1 be 1 mm or less.

The "spacers 13 may include an outer peripheral spacer 13A provided in a peripheral portion of the substrate with spacers so as to surround the substrate with spacers, and the air outlet 21a may be provided in a surrounding surface 13a of the outer peripheral spacer 13A."

Integrating the air outlets 21a increases convenience in performing the treatment. In particular, in the case of sealing the substrates 1, 12 by holding them together by the chuck 25, the substrates 1, 12 can be more easily sealed if the air outlet 21a is smaller. The outer peripheral spacer 13A can be provided in this case.

Figure 14:
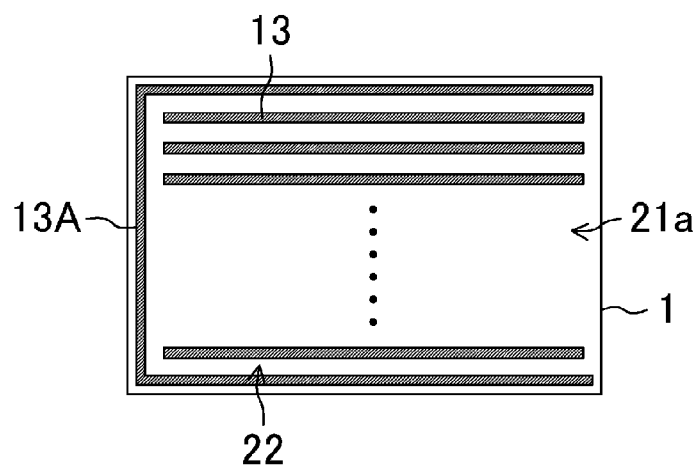
FIG. 14 is a schematic plan view showing a form of the spacers.

FIG. 14 shows a specific example. In this example, the outer peripheral spacer 13A is formed in a U-shape as viewed in plan, and the air outlet 21a is formed in one side of the element substrate 1. Thus, in this case, only one side of the element substrate 1 is sealed by the chuck 25.

Figure 15:
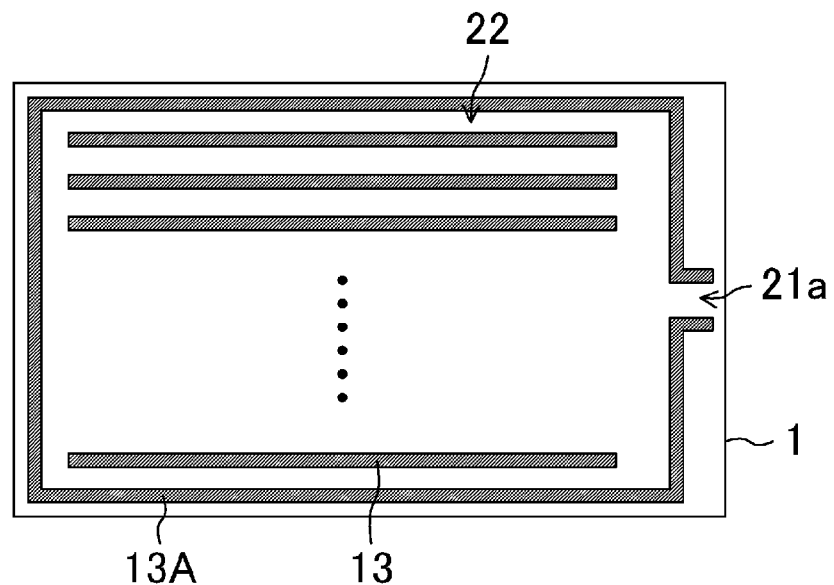
FIG. 15 is a schematic plan view showing a form of the spacers.

As shown in FIG. 15, the air outlet 21a may be formed in a groove shape that opens at one position in the outer peripheral spacer 13A. This further facilitates sealing.

It is preferable that "in the case where the substrate with spacers is formed in a rectangular shape, the outer peripheral spacer 13A is formed symmetrically with respect to at least one of imaginary axes of symmetry extending along sides of the substrate with spacers and extending through a center of the primary surface."

When bonding the substrates 1, 12 and holding them together, uniformity is required so that the gap between the substrates is constant over the entire surface. Thus, symmetrically placing the outer peripheral spacer 13A enables the substrates to be held together in a well-balanced state, whereby the uniformity can be ensured.

Figure 16:
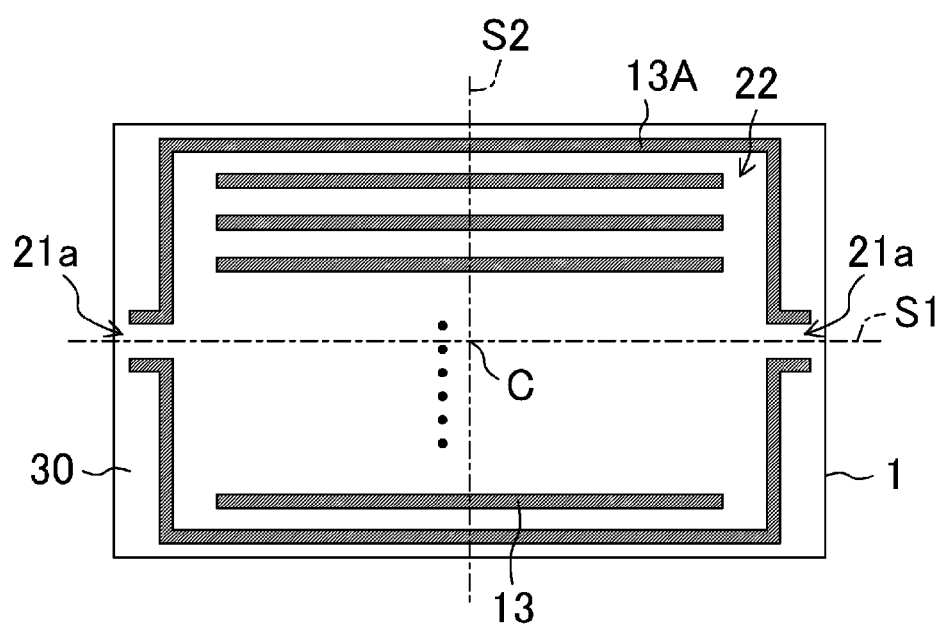
FIG. 16 is a schematic plan view showing a form of the spacers.

FIG. 16 shows a specific example. In the figure, reference character "C" represents the center of a primary surface 30, and reference characters "S1," "S2" represent imaginary axes of symmetry. In the outer peripheral spacer 13A of this example, air outlets 21a are provided at two positions in a laterally symmetrical manner. The outer peripheral spacer 13A of FIG. 15 has a laterally asymmetrical shape, whereas the outer peripheral spacer 13A of this example has a vertically and laterally symmetrical shape. Thus, the uniformity can further be ensured.

Even if the outer peripheral spacer 13A has an asymmetrical shape, the symmetry can be complemented by providing dummy spacers. Specifically, the "outer peripheral spacer 13A may be formed asymmetrically with respect to at least one of the imaginary axes S1, S2 of symmetry extending along the sides of the substrate with spacers and extending through the center of the primary surface, and a dummy spacer complementing line symmetry of the outer peripheral spacer 13A may be provided in a periphery of the outer peripheral spacer 13A."

Figure 17A:
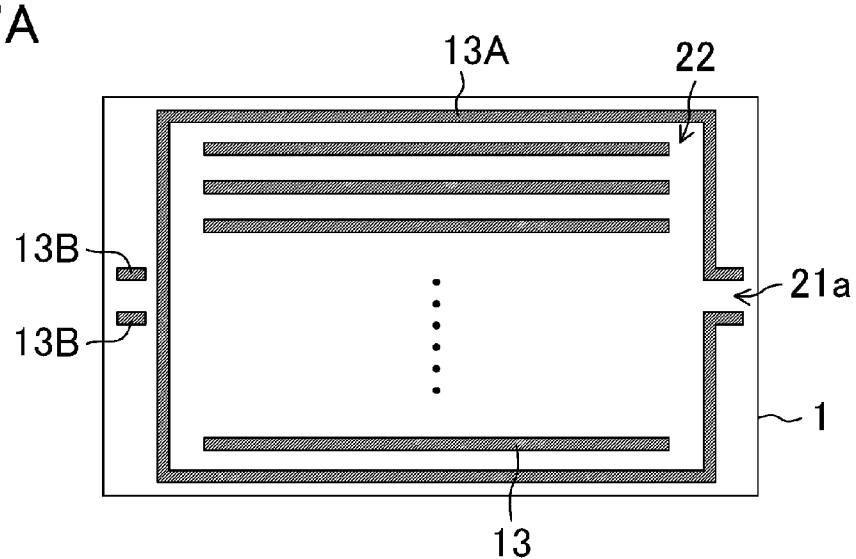
FIGS. 17A-17B are schematic plan views showing a form of the spacers.
Figure 17B:
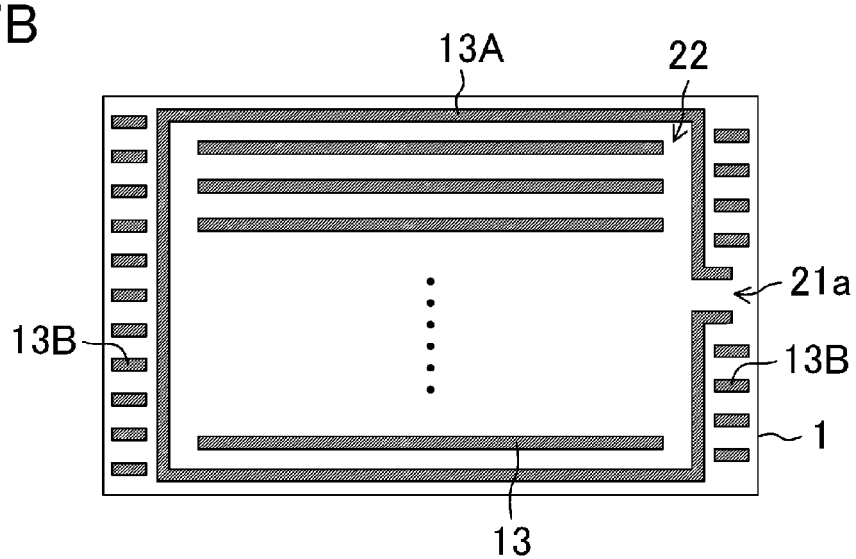

FIGS. 17A-17B show specific examples. In FIGS. 17A-17B, reference character "13B" represents a dummy spacer. A groove-like air outlet 21a is provided at one position in the outer peripheral spacer 13A in order to facilitate sealing. In FIG. 17A, dummy spacers 13B having substantially the same form as that of the air outlet 21a are provided in a line symmetrical manner. In FIG. 17B, a multiplicity of dummy spacers 13B, 13B, . . . are arranged in a line symmetrical manner in the periphery of the asymmetrical portion of the outer peripheral spacer 13A. Arranging the multiplicity of dummy spacers 13B, 13B, . . . in the line symmetrical manner reduces the influence of the asymmetrical shape of the outer peripheral spacer 13A, whereby the overall symmetry of the element substrate 1 can be ensured.

Thus, even if the outer peripheral spacer 13A has an asymmetrical shape, symmetry can be ensured by providing the dummy spacers 13B, whereby both uniformity and convenience can be obtained.

The organic EL element formed by this manufacturing method can be formed to have an excellent structure that improves its characteristics.

Specifically, the "spacers 13 are provided on the element substrate 1, and an equal-thickness layer having substantially the same thickness both on the element substrate 1 and on the spacers 13 is included in the organic layer 4." Note that as used herein, the expression "substantially the same" means that the average thickness on the spacers 13 is, e.g., 0.5 to 1.0 times as large as that on the element substrate 1.

The spacers are typically formed on the element substrate in order to maintain a constant distance between the element substrate and a mask by the spacers when patterning the light emitting layer in a mask deposition method, or in order to prevent color mixture from being caused by the spacers during patterning in an IJ method.

Figure 18:
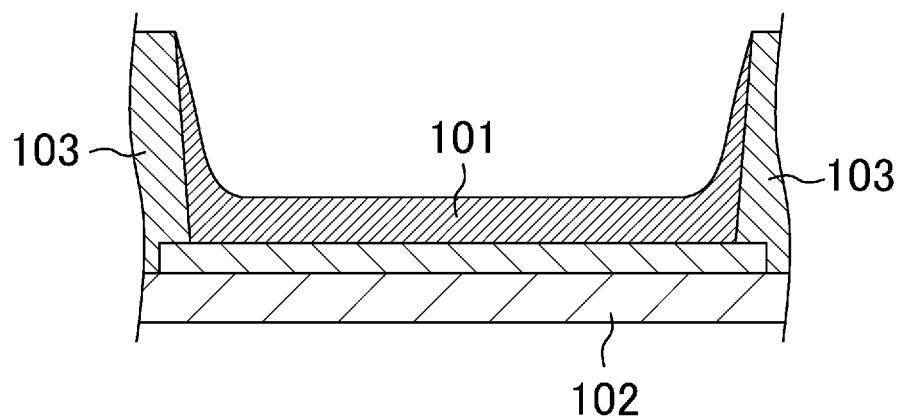
FIG. 18 is a schematic cross-sectional view of a conventional organic EL element.

As shown in FIG. 18, an organic film 101 formed by these methods has a smaller thickness on the spacers 103 than on the element substrate 102. That is, the stacking material that is injected by the IJ method has directionality, and the TS distance is long in the vacuum deposition method, whereby the sublimated stacking material flies with directionality. Thus, almost no layer is formed on the spacers 103.

In such a case, leakage tends to occur between the anode and the cathode, which may reduce light emission efficiency.

Figure 19:
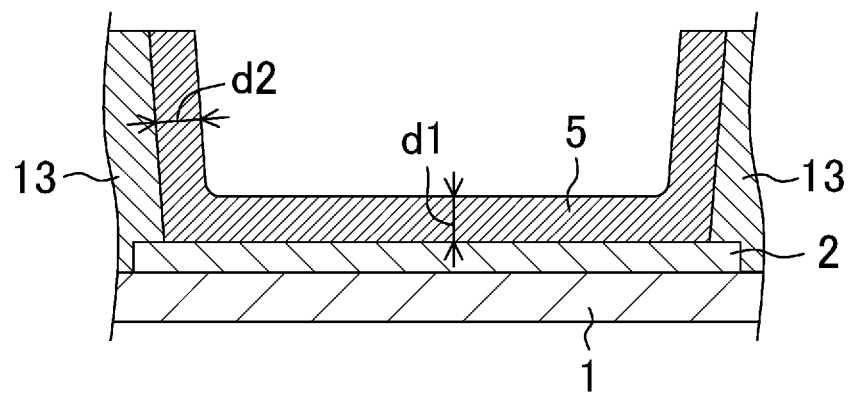
FIG. 19 is a schematic cross-sectional view of the organic EL element of the embodiment.

On the other hand, according to this manufacturing method, the stacking material flies with no directionality in the small space surrounded by the spacers 13, the element substrate 1, and the transfer substrate 12. Thus, as shown in FIG. 19, a layer (the equal-thickness layer) is formed whose thickness d1 on the element substrate 1 and thickness d2 on the spacers 13 are substantially the same. Accordingly, leakage is less likely to occur, whereby an element structure having high light emission efficiency can be formed.

Moreover, reliability of the organic EL element can be improved. That is, a planarizing layer etc. that is provided on the spacers 13 and the element substrate 1 is often comprised of a resin. In this case, water or gas is generated. If such water etc. enters the light emitting layer, quality is reduced, and reliability is reduced.

Accordingly, entrance of water etc. can be effectively prevented if a layer is formed which has substantially the same thickness both on the element substrate 1 and on the spacers 13.

EXAMPLES

Specific examples (first to thirteenth examples) will be described below.

First Example

<Structure of Organic EL Element>

Figure 20:
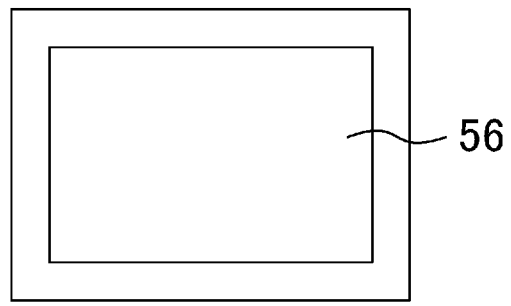
FIG. 20 is a schematic plan view of a lighting apparatus in a first example.
Figure 21A:
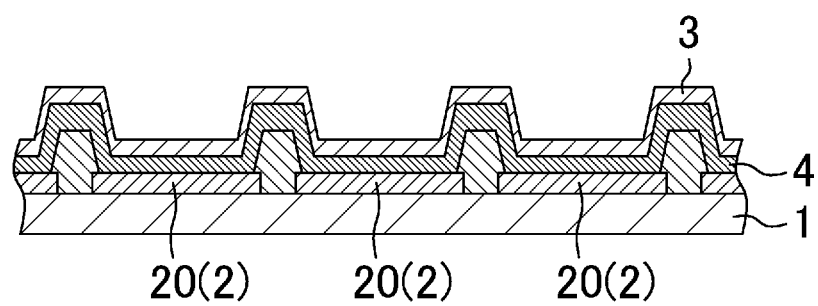
FIGS. 21A-21B are schematic cross-sectional views of an organic EL element of the first example, where
Figure 21B:
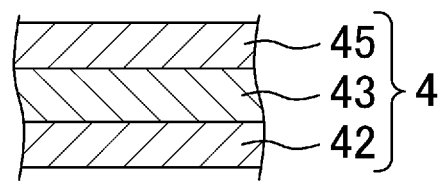

FIGS. 20 and 21A-21B show an organic EL element of this example. FIG. 20 shows a lighting apparatus formed in the shape of a flat plate. A lighting portion 56 that emits light is formed on one surface of the lighting apparatus. FIGS. 21A-21B show a cross-sectional structure of the organic EL element that forms the lighting portion 56. Note that the organic EL element in this example is for testing purposes, and thus has a simplified structure.

As shown in FIGS. 21A-21B, in this organic EL element, lower electrodes (anodes 2) are formed on an element substrate 1 of glass. The anodes 2 are comprised of ITO. The anodes 2 are formed by a plurality of strip-shaped pixel electrodes 20, 20, . . . extending parallel to each other, and are arranged in a stripe pattern. A hole transport layer 42 having a thickness of 65 nm is formed on the anodes 2. The hole transport layer 42 is comprised of α-NPD.

A light emitting layer 43 having a thickness of 30 nm is formed on the hole transport layer 42. The light emitting layer 43 is comprised of Alq3. An electron injection layer 45 comprised of LiF and having a thickness of 5 nm is formed on the light emitting layer 43. An upper electrode (a cathode 3) is formed on the electron injection layer 45. The cathode 3 is comprised of aluminum (Al) and has a thickness of 100 nm. In this example, the hole transport layer 42 and the light emitting layer 43 in an organic layer 4 are formed by this manufacturing method.

<Manufacturing Method of Organic EL Element>

FIGS. 22A-22G show a manufacturing flow of the organic EL element. This manufacturing flow will be described below.

(Preparation of Donor Substrate 10)

A glass plate that allows radiated light emitted from a halogen lamp to pass therethrough was used as a donor substrate 10. It should be understood that the material of the donor substrate 10 is not limited to glass, and the donor substrate 10 may be comprised of any material as long as it allows the radiated light to pass therethrough. As shown in FIG. 22A, a film of molybdenum (Mo) that absorbs the radiated light was formed with a thickness of 1,000 Å on the donor substrate 10 by a sputtering method. Note that the Mo film corresponds to a heat generating layer 16. The heat generating layer 16 is not limited to Mo, and may be comprised of titanium (Ti) or aluminum (Al).

Then, as shown in FIG. 22B, a transfer layer 11 was formed on the Mo film, whereby a transfer substrate 12 was fabricated. A specific method for forming the transfer layer 11 will be described later.

(Preparation of Element Substrate 1)

Figure 22C:
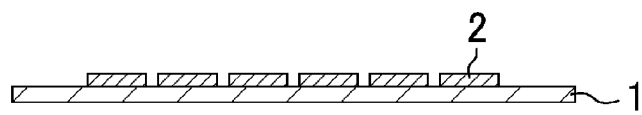
Figure 22D:
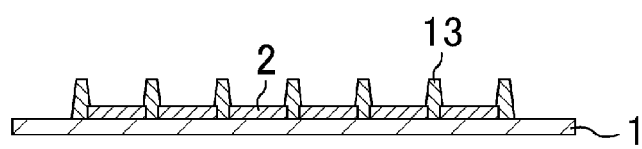

As shown in FIG. 22C, a plurality of anodes 2 having a width of 120 µm were formed at intervals of 20 µm in a stripe pattern on an element substrate 1 by photolithography. Then, as shown in FIG. 22D, elongated wall-shaped spacers 13 were formed between adjoining ones of the anodes 2. The spacers 13 were comprised of photosensitive polyimide (made by NISSAN CHEMICAL INDUSTRIES, LTD.), and were formed to have a height of 3 µm from the element substrate 1 and a maximum width of 30 µm.

A plurality of spacers 13 (not shown) having a maximum width of 15 µm and a cut-out width of 130 µm were formed in the lighting portion 56 so as to extend perpendicularly to the anodes 2. The width of these spacers 13 gradually increases from the side of their base ends (the side of the substrate 20) to the side of their tip ends (a reverse tapered shape). Note that the material of the spacers 13 is not limited to a polyimide resin, and may be appropriately selected as required. For example, the spacers 13 may be comprised of an inorganic material.

The overall arrangement of the spacers 13 on the element substrate 1 is as shown in FIG. 17B. An air outlet 21a is formed so as to open at a position located 1 mm inside the edge of the element substrate 1. Although the spacers 15 were originally arranged as shown in FIG. 15, such an improvement was made on the arrangement of the spacers 15 because pressure bonding was not sufficient in some cases. As a result, stable pressure bonding was able to be achieved.

Thereafter, as described below, the organic layer 4 was formed over the element substrate 1, and finally the cathode 3 is vacuum deposited on the entire surface, thereby completing the organic EL element. In the lighting portion 56, the cathode 3, which is divided by the spacers 13 having the reverse tapered shape and is formed in a stripe pattern having a width of 120 µm, is formed so as to extend perpendicularly to the anode. As a result, a group of 120 µm by 120 µm pixels arranged in a grid pattern are formed in the lighting portion 56.

(Formation of Hole Transport Layer 42)

As shown in FIG. 22B, substantially the entire surface of the donor substrate 10 was coated with a film-forming solution to fabricate the transfer substrate 12. The film-forming solution was a mixed solvent of THF and NMP with 8 mg/l of α-NPD dissolved therein. The coating was performed by using an inkjet (IJ) film-forming apparatus for coating the entire surface, and the donor substrate 10 was coated with the film-forming solution so that the transfer layer 11 having a thickness of 70 nm was formed thereon. It took 30 seconds to form the transfer layer 11. The material utilization efficiency was about 90%.

Since the coating was performed while heating the donor substrate 10, the solvent had already been evaporated at the time the coating was completed. Since no separate drying step was required, the process was able to be simplified. The transfer layer 11 thus formed was observed by atomic force microscopy (AFM). According to the observation, the film formed was generally uniform, but agglomerates having a diameter of about 10 nm were recognized in places.

Figure 22E:
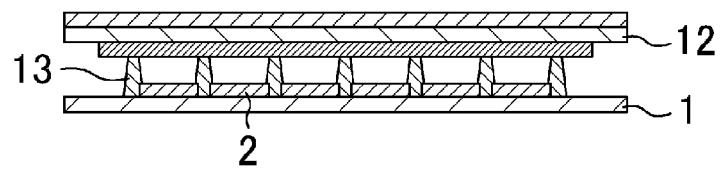
Figure 22F:
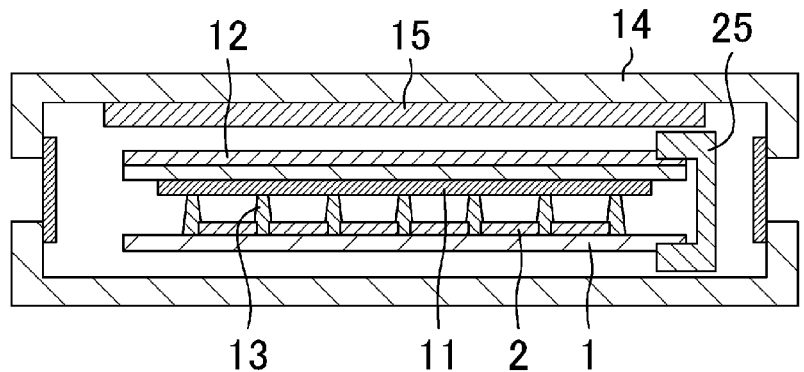

As shown in FIG. 22E, the transfer substrate 12 thus fabricated was bonded with the element substrate 1 so that the surface of the transfer substrate 12, which has the transfer layer 11 formed thereon, faced the element substrate 1. In this state, the transfer substrate 12 and the element substrate 1 were held in a vacuum chamber 14 as shown in FIG. 22F, and a transfer treatment was performed.

The vacuum chamber 14 is configured as shown in FIG. 9 described above. In this example, the vacuum chamber 14 capable of maintaining high vacuum higher than $10^{-3}$ Pa therein was used, and the degree of vacuum was $4 \times 10^{-4}$ Pa. A halogen lamp was used as a heat source 15. Specifically, a surface emission halogen lamp ("UHMA1-CL1000" made by USHIO INC.) was used.

The transfer substrate 12 was bonded with the element substrate 1 so that the gap between the substrates 1, 12 was hermetically sealed in the vacuum chamber 14.

Figure 23A:
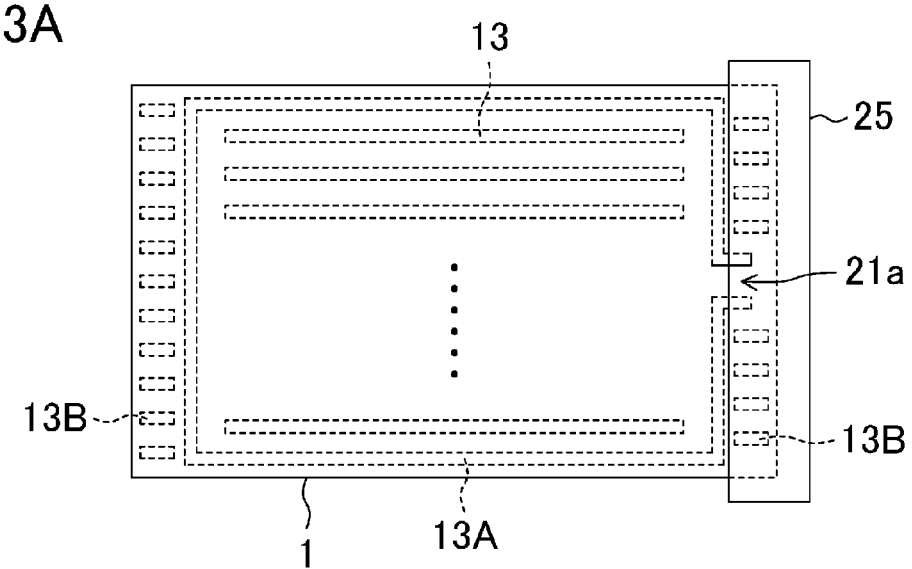
FIGS. 23A-23B are diagrams showing a transfer substrate and an element substrate that are placed so as to face each other, where
Figure 23B:
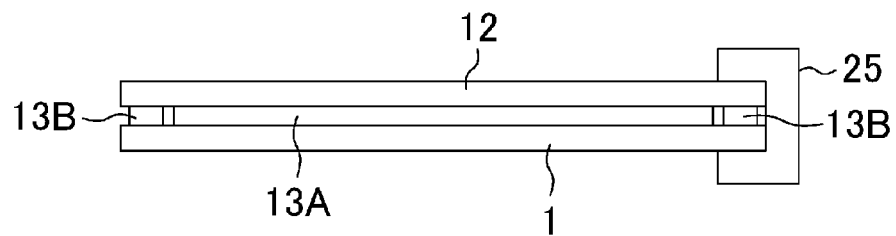

Specifically, as shown in FIGS. 23A-23B, a chuck 25 made of an elastic material such as rubber, silicon, etc. was attached to a portion where the air outlet 21a was located. Then, air was gradually removed from the vacuum chamber 14 to depressurize the vacuum chamber 14. Since the space partitioned by the spacers 13 between the substrates 1, 12 communicates with the vacuum chamber 14 via the air outlet 21a, this space can be depressurized similarly to the vacuum chamber 14. Subsequently, the vacuum chamber 14 was depressurized to the above degree of vacuum, and then the degree of vacuum in the vacuum chamber 14 was quickly reduced. In this manner, the air outlet 21a is sealed by the chuck 25, and the pressure in the gap between the substrates 1, 12 is relatively reduced, and the entire surfaces of the substrates 1, 2 are uniformly brought into close contact with each other.

The substrates 1, 12 may be bonded together after placing the substrates 1, 12 in the vacuum chamber 14 and depressurizing the vacuum chamber 14 to a predetermined degree of vacuum. This is advantageous in that the process can be performed in a short time because the pressure is reduced before bonding the substrates.

In either case, the substrates 1, 12 closely contact each other due to the difference in pressure, whereby a small gap (TS distance) can be maintained between the entire surfaces of the transfer substrate 12 and the element substrate 1.

The substrates positioned in place were irradiated with the halogen lamp from the side of the transfer substrate 12. The halogen lamp was heated until the surface temperature of the transfer substrate 12 reached 300° C. (10 seconds).

Figure 22G:
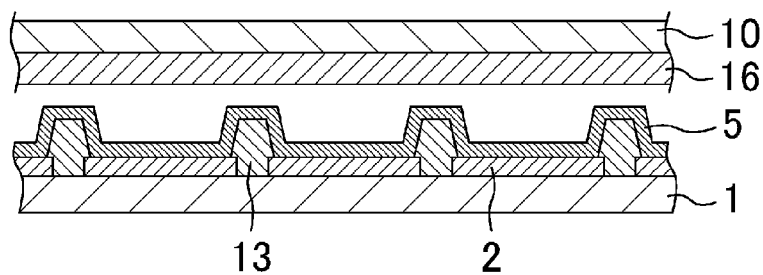

As shown in FIG. 22G, since high vacuum is maintained in the vacuum chamber 14, the transfer layer 11 is sublimated and flies, whereby an organic film 5 is formed over the element substrate 1. Specifically, with the transfer layer 11 having a thickness of 70 nm, the organic film 5 was formed with a thickness of 65 nm over the element substrate 1, with a thickness of 60 nm on the side surfaces of the spacers 13, and with a thickness of 70 nm on the upper ends of the spacers 13. After the transfer, there was almost no transfer layer 11 left on the transfer substrate 12. This seems to be because the Mo film functioned well as the heat generating layer 16.

Moreover, since the film is evenly formed over the element substrate 1 and on the spacers 13, leakage between the electrodes 2, 3 can be effectively prevented. Furthermore, since the entire transfer layer 11 can be transferred, the material utilization efficiency can be significantly improved.

Note that the organic film 5 formed by the transfer was observed by AFM. According to the observation, the agglomerates recognized in the transfer layer 11 were not present in the organic film 5, and the organic film 5 had a uniform structure.

(Formation of Light Emitting Layer 43 Etc.)

By performing a treatment similar to that for forming the hole transport layer 42, the light emitting layer 43 was further formed over the element substrate 1 having the hole transport layer 42 formed thereon. After the light emitting layer 43 was formed, the electron injection layer 45 and the cathode 3 were sequentially formed with a thickness of 5 nm and 100 nm, respectively, on the light emitting layer 43 by a vacuum deposition method, whereby the organic EL element was completed.

(Characteristics of Organic EL Element)

Characteristics of the organic EL element (the example) thus fabricated were examined by using comparative examples. An organic EL element (a first comparative example) having spacers 13 formed in a manner similar to that of the example and an organic EL element (a second comparative example) having no spacers 13 were fabricated as the comparative examples. The comparative examples were fabricated under the same conditions as those of the example except that the hole transport layer 42 and the light emitting layer 43 were formed by a vacuum deposition method in the comparative examples.

The result showed that, no leakage current was recognized in the example and the second comparative example, and the organic EL elements of the example and the second comparative example had similar characteristics, whereas a leakage current was recognized in the first comparative example. The luminous efficiency also decreased by about 20%, and light emission was not stable. It seems that in the first comparative example, leakage occurred at the edge portions of the spacers 13.

Second Example

This example is different from the first example in the configuration of a stacking material of the light emitting layer 43, and in that a film-forming treatment of the light emitting layer 43 was performed in a dry atmosphere. Since this example is otherwise similar to that of the first embodiment, the differences between this example and the first example will be described in detail below.

A mixed material of a phosphorescent material and CBP was used as a light emitting material, instead of Alq3. It is known that this light emitting material is less resistant to the atmosphere than Alq3 is. This light emitting material was dissolved in an organic solvent, and a film was formed by coating with the resultant solution. At this time, the atmosphere was controlled by a dry-air producing apparatus so that the atmosphere had a dew-point temperature of −20° C.

In the case where a film was formed under a normal atmosphere, degradation of the phosphorescent material was recognized, and the luminous efficiency decreased by about 20% as compared to the case where a vacuum deposition method was used. In this example, however, almost no decrease was recognized in luminous efficiency.

Since dry air having a dew-point temperature of −20° C. can be easily obtained by merely attaching a filter etc. to a common compression-air producing apparatus, manufacturing cost can be reduced. Moreover, water and oxygen need not be completely removed after the coating with the solution, because they can be removed in the transfer treatment.

Third Example

This example is similar to the first example except that a heat source capable of emitting pulsed radiation of thermal energy was used as the heat source 15.

A xenon flash anneal lamp capable of emitting pulsed radiation was used as the heat source 15. This xenon lamp is a modified product of a lamp made by USHIO INC. Light emitted from this xenon lamp is white light having a wavelength of 200 to 1,100 nm with peak intensity at 450 to 500 nm The radiation time can be controlled in the range of 1 msec or less. In this example, radiation was controlled so that the surface temperature of the transfer substrate 12 reached 300° C. by radiation for 1 msec.

The heat generating layer 16 was comprised of titanium (Ti). Ti is preferable as the heat generating layer 16 for xenon lamps, because Ti absorbs more visible light than other metals.

Thus, using the pulsed radiation of thermal energy can limit the heated portion to the surface. Continuous irradiation may heat an unnecessary portion because thermal energy is transmitted deep into the film or the substrate. As a result, only the transfer layer 11 was able to be intensively heated.

Since white light having a predetermined wavelength was used, the heat generating layer 16 was able to be intensively heated. This is because glass and metals reflect white light. The halogen lamp of the first example heats glass etc. as well because it emits infrared light.

In the first example, the time to cool the element substrate 1 was required after the transfer treatment because the temperature of the element substrate 1 increased by the transfer treatment. In this example, however, the temperature of the element substrate 1 was almost the same even immediately after the transfer step. Thus, quick continuous transfer can be performed, whereby cycle time can be reduced.

Fourth Example

In this example, a titanium film having a thickness of 100 µm was used as the donor substrate 10. This example is otherwise similar to the third example.

Using the titanium film as the donor substrate 10 can simplify the manufacturing process because a titanium film need not be formed on a glass plate. Moreover, the cost can be reduced because no glass plate is used.

Figure 24:
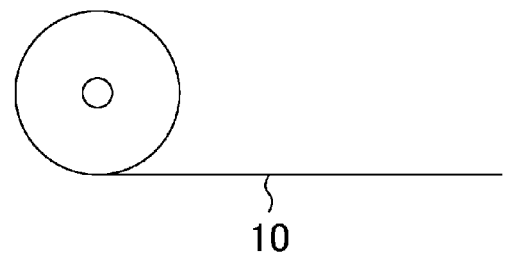
FIG. 24 is an illustration of a fourth example.

As shown in FIG. 24, since the titan film can be supplied in the form of a roll, the titanium film can be applied to a roll-to-roll continuous manufacturing process. Thus, further reduction in cycle time can be expected.

Fifth Example

This example is different from the first example in that a small droplet spray method was used as a film-forming treatment of the light emitting layer 43. Although the donor substrate 10 was heated in the film-forming treatment in the first example, the donor substrate 1 is not heated in this example.

In this example, a film-forming solution was produced by dissolving Alq3 in a solvent, and was sprayed to the donor substrate 10 by using a spray apparatus ("STS-200" made by Produce Co., Ltd.). The distance between the spray apparatus and the donor substrate 10 was adjusted so that sprayed droplets become almost dry at the time the droplets reach the donor substrate 10. As a result, the droplets solidify in the shape of particles when reaching the donor substrate 10, thereby forming a film on the donor substrate 10. The film thus formed had a structure in which fine particles having a particle size of about 1 μm were continuously bonded together.

The light emitting layer 43 was formed over the element substrate 1 by processing in a manner similar to that of the first example the transfer substrate 12 thus obtained. The light emitting layer 43 had a uniform structure with no particle-like structure recognized therein. In this example, the time required for transfer was reduced by 20% as compared to the first example. This seems to be because the transfer layer 11 having the structure in which fine particles are continuously bonded together has a larger surface area and thus can be more easily heated, as compared to the transfer layer 11 having a uniform structure. Thus, reduction in cycle time can be implemented by using such a small droplet spray method as the film-forming treatment.

Sixth Example

In this example, the transfer layer 11 was formed over a part of the surface of the donor substrate 10 rather than over the entire surface of the donor substrate 10 when forming the light emitting layer 43. This example is otherwise similar to the first example.

Figure 25A:
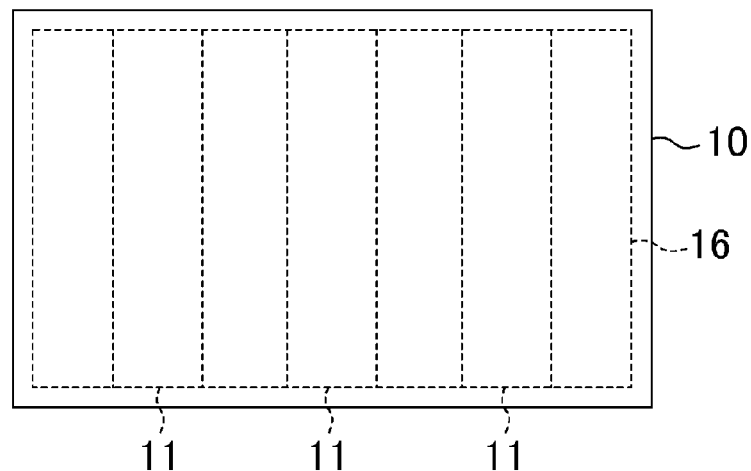
FIGS. 25A-25C are illustrations of a sixth example, where

As shown in FIG. 25A, transfer layers 11 (Alq3) having a width of 80 μm and a thickness of 100 nm were formed in a stripe pattern over the donor substrate 10 by a printing method, whereby the transfer substrate 12 was fabricated. The method for forming the transfer layers 11 is not limited to the printing method, and the transfer layers 11 may be formed by an inkjet (IJ) method, a screen printing method, etc.

Figure 25B:
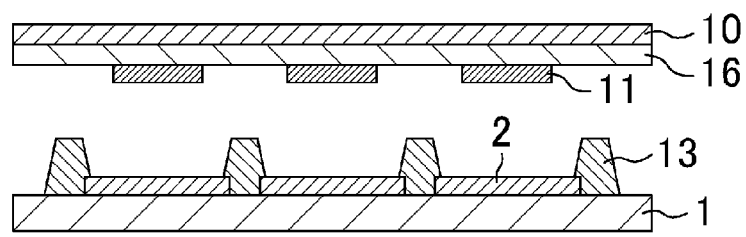

As shown in FIG. 25B, the transfer substrate 12 thus fabricated was placed so that each transfer layer 11 faced a corresponding one of the anodes 2 between the spacers 13, and a transfer treatment was performed. At this time, adjustment was made to separate the transfer substrate 12 from the element substrate 1 by a predetermined TS distance.

Figure 25C:
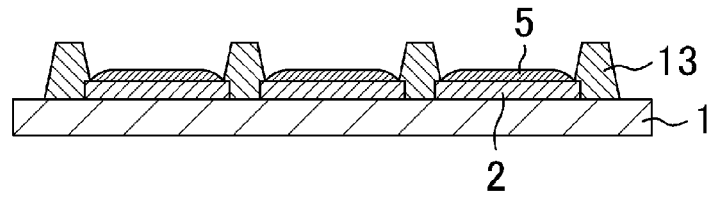

FIG. 25C schematically shows a cross-sectional structure of the organic film 5 (Alq3) thus formed over the element substrate 1. The organic film 5 was hardly formed on the side surfaces of the spacers 13, and was intensively formed on the anodes 2. This seems to be because the adjustment that was made to separate the transfer substrate 12 from the element substrate 1 by the predetermined TS distance caused directionality in the transfer as in the vacuum deposition method.

In the organic EL element of this example, the hole transfer layer 42 is uniformly formed over the entire surface. Thus, although the light emitting layer 43 is not formed on the side surfaces of the spacers 13, there is no problem in terms of prevention of leakage.

Since the light emitting layer 43 is intensively formed on the anodes 2, the amount of stacking material to be used can be reduced, whereby the material utilization efficiency can further be improved.

In the transfer treatment, the transfer layers are sublimated and transferred to the element substrate 1. The transfer layers 11 having an excessively uneven thickness or the transfer layers 11 having meanders may result in unevenness in the transferred layers. However, since the space where the stacking material flies is divided into small spaces by the spacers 13 formed in the stripe pattern, the impact of the unevenness can be suppressed.

In this respect, transfer substrates 12 (test substrates) with the transfer layers 11 having meanders of about 20 μm were fabricated and examined. An element substrate 1 with spacers 13 having a dot-shaped cross section was fabricated as a comparative example. A transfer treatment was performed on the element substrate 1 of the comparative example and the element substrate 1 of this example by using the test substrates.

The result showed that unevenness spreading about 50 μm was recognized in the comparative example, whereas almost no unevenness was recognized in the example. Thus, uniformity of the organic film 5 can be improved by dividing the space where the stacking material flies into small spaces by the spacers 13.

Seventh Example

In this example, as in the sixth example, the transfer layer 11 is formed over a part of the surface of the donor substrate 10 rather than over the entire surface of the donor substrate 10 when forming the light emitting layer 43. This example is different from the sixth example in that the spacers 13 are formed so as to surround each anode 2, and that the transfer layer is formed in a spot pattern.

Figure 26A:
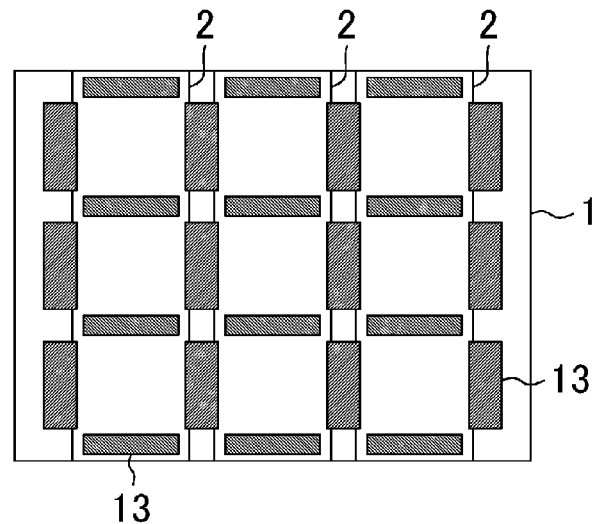
FIGS. 26A-26B show an element substrate in a seventh example, where
Figure 26B:
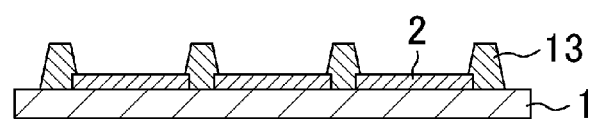

FIGS. 26A-26B show an element substrate 1 of this example. As shown in FIGS. 26A-26B, each spacer 13 was formed in a rectangular shape having a size of 100 μm by 10 μm and a height of 3 μm from the element substrate 1. A plurality of spacers 13 (first spacers) were arranged so that each spacer 13 was placed between adjoining ones of band-shaped anodes 2 and that adjoining ones of the spacers 13 were separated from each other. A plurality of spacers 13 (second spacers) extending perpendicularly to the first spacers were arranged on the anodes 2 so that adjoining ones of the spacers 13 were separated from each other. Areas (pixels) each having a size of 120 μm by 120 μm were defined on the element substrate 1 having the first and second spacers arranged thereon.

Figure 27A:
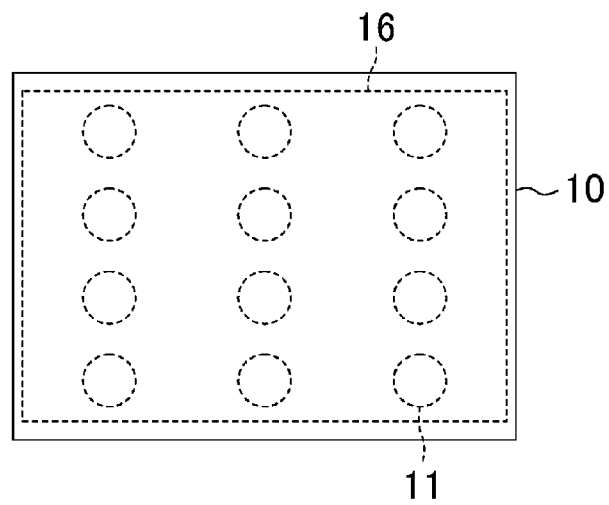
FIGS. 27A-27B show a transfer substrate in the seventh example, where
Figure 27B:
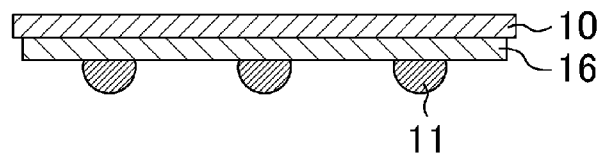

FIGS. 27A-27B show a transfer substrate of this example. As shown in FIGS. 27A-27B, spot-like transfer layers 11 (Alq3) were respectively formed in the central portions of the areas corresponding to the pixels. Each transfer layer 11 has a semispherical shape having a radius of 40 μm and a maximum height of 120 μm from the donor substrate 10.

A film-forming treatment was performed by providing the surface of the Mo film (the heat generating layer 16) with liquid repellency by a plasma treatment, and causing droplets of a film-forming solution to adhere to a predetermined area in the surface of the Mo film by an IJ method. The present invention is not limited to the IJ method, and a printing method, a screen printing method, etc. may be used.

The transfer substrate 12 thus fabricated and the element substrate 1 were subjected to a transfer treatment as in the first example. In the transfer treatment, the transfer substrate 12 and the element substrate 1 were aligned so that the transfer layers 11 faced the anodes 2. Moreover, adjustment was made so that the transfer substrate 12 was separated from the element substrate 1 by a predetermined TS distance.

Figure 28A:
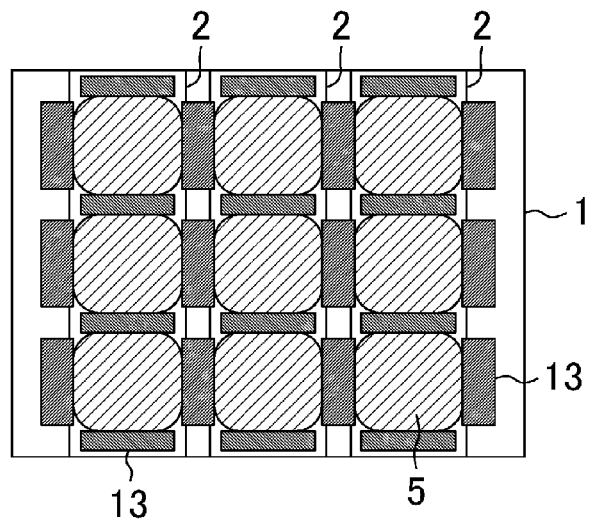
FIGS. 28A-28B show the element substrate after transfer in the seventh example, where
Figure 28B:
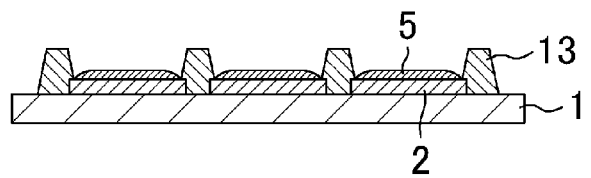

FIGS. 28A-28B schematically show a cross-sectional structure of the organic film 5 (Alq3) formed over the element substrate 1. As shown in these figures, almost no organic film 5 was formed on the side surfaces of the spacers 13, and the organic film 5 was intensively formed on the anodes 2.

An IJ method may cause displacement of the transfer layers 11. Excessive displacement of the transfer layers 11 may result in unevenness in the transferred layer. However, since the space where the stacking material flies is divided into small spaces by the spacers 13 formed in the stripe pattern, the impact of the unevenness can be suppressed.

In this respect, as in the sixth example, transfer substrates 12 (test substrates) with the transfer layers 11 displaced by about 20 μm were fabricated and examined. The result showed that unevenness spreading about 50 μm was recognized in the comparative example, whereas almost no unevenness was recognized in the example.

Eighth Example

This example is different from the first example in that the spacers 13 are formed on the transfer substrate 12.

Figure 29A:
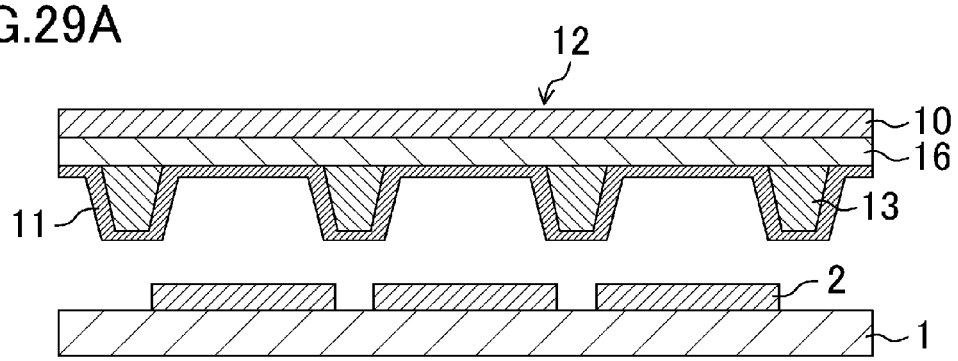
FIGS. 29A-29B are illustrations of an eighth example, where

FIG. 29A shows the transfer substrate 12 and the element substrate 1 of this example. As shown in this figure, instead of being formed on the element substrate 1, the spacers 13 were formed on the side of the heat generating layer 16 of the donor substrate 10 in a manner similar to that of the element substrate 1 of the first example. The transfer layer 11 (Alq3) for the light emitting layer 43 was formed over substantially the entire surface of the donor substrate 10 having the spacers 13 formed thereon. A transfer treatment was performed in a manner similar to that of the first example by using the element substrate 1 and the transfer substrate 12.

Figure 29B:
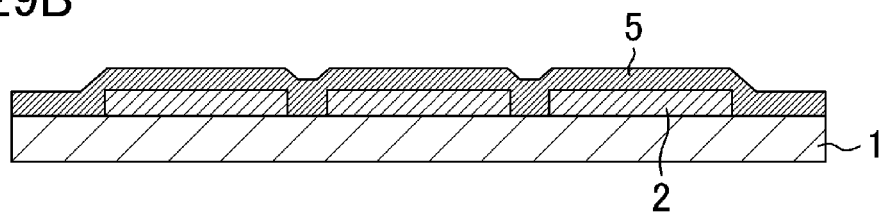

FIG. 29B schematically shows a cross-sectional structure of the organic film 5 (Alq3) formed over the element substrate 1. As shown in FIG. 29B, the organic film 5 was substantially uniformly formed over the element substrate 1. Since there were no spacers 13, a substantially flat organic film 5 was able to be formed on the element substrate 1. Note that in this example, the spacers 13 were also heated, and thus the transfer layer 11 located on the upper ends of the spacers 13 was also entirely transferred.

This example is advantageous in that the aperture ratio can be increased. For example, this example is preferable in the case where the presence of the spacers 13 greatly affects the aperture ratio of the pixels in a fine-pitch configuration, or in lighting applications for which high luminance is required.

Ninth Example

This example is different from the first example in that the spacers 13 were formed in a dot shape. In this example, instead of the spacers 13 formed in a stripe pattern, the spacers 13 were formed in the shape of a prism having a cross section with a size of 30 μm by 30 μm, and were arranged at intervals of 120 μm.

This example is advantageous in that the area occupied by the spacers 13 on the element substrate 1 can be reduced and thus the aperture ratio can be increased.

Note that in any of the seventh to ninth examples, the form of the spacers 13 may be appropriately designed as required.

Tenth Example

This example is different from the third example in the heat treatment in the transfer step. Specifically, multiple irradiation was conducted.

Figure 30A:
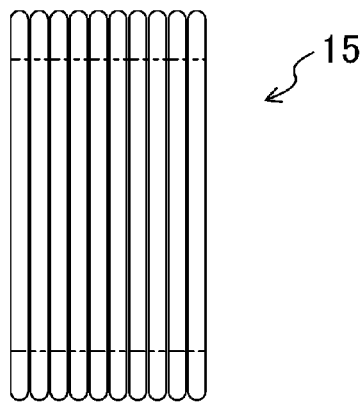
FIGS. 30A-30B are diagrams illustrating a heat source in a tenth example, where
Figure 30B:
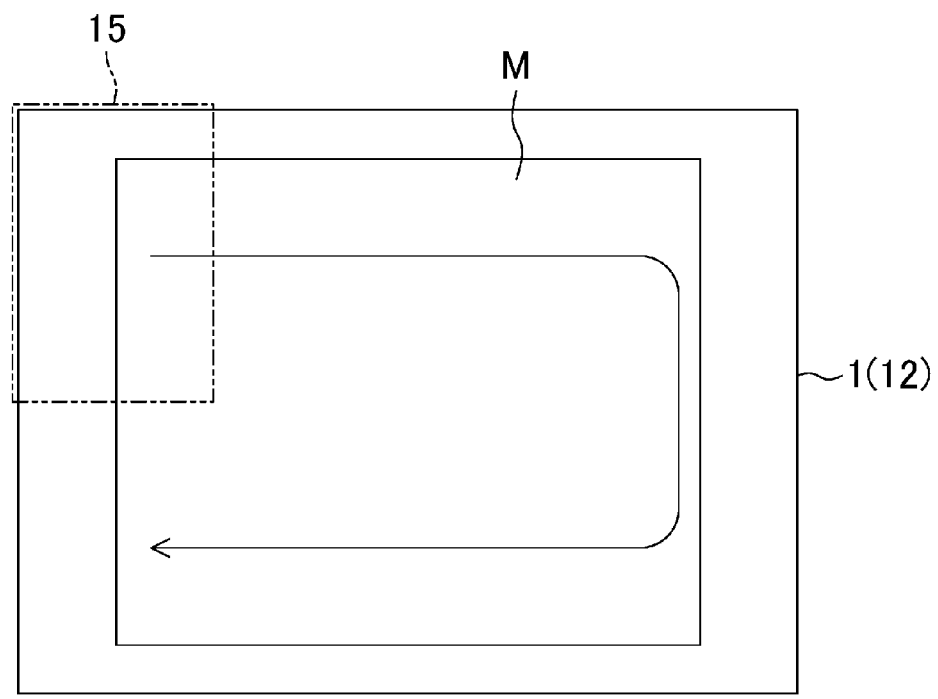

As shown in FIG. 30B, the element substrate 1 used in this example is the same as that of the third example, and has a size of 30 cm by 40 cm. An effective area M of the organic EL element on the primary surface of the element substrate 1 is 25 cm by 35 cm. Note that the dimensions of the transfer substrate 12 are similar to those of the element substrate 1.

In the third example, twenty xenon flash lamps having a width of 1 cm and a length of 20 cm were arranged to form the heat source 15. The intensity of light radiated from the xenon flash lamps is relatively uniform in the lateral direction of the lamps, but tends to be lower in end portions in the longitudinal directions of the lamps. In particular, the difference in intensity tends to increase with time. Thus, the radiation amount may become uneven even if the xenon flash lamps are evenly arranged.

Thus, this example was designed so as to implement uniform irradiation by radiating light while moving the light source 15.

Specifically, as shown in FIG. 30A, 10 xenon flash lamps were arranged next to each other to form the light source 15 (an element light source 15a). In this case, the range capable of uniformly radiating light in the heat source 15 had a size of 15 cm by 10 cm. The heat source 15 was configured so as to be movable in the vacuum chamber 14 by sliding parallel to the transfer substrate 12.

With the heat source 15 thus configured, irradiation was performed four times each way while reciprocating the heat source 15 in the longitudinal direction of the transfer substrate 12, and shifting the position of the heat source 15 in the lateral direction of the transfer substrate 12 when changing the moving direction in the longitudinal direction, as shown by arrow in FIG. 30B. The entire effective area of the organic EL element was irradiated in this manner. The irradiation time per irradiation was about 100 msec, and all the irradiations were completed in about 5 seconds. The irradiation ranges partially overlap each other, but this did not cause any problem.

In this manner, different areas of the transfer substrate 12 are heated by the heat source 15, and transfer is performed a plurality of times, whereby the transfer can be uniformly and efficiently performed without significantly reducing the cycle time. Since the heat source 15 is reduced in size, the cost for members and the running cost can be reduced.

(Modification)

Figure 31A:
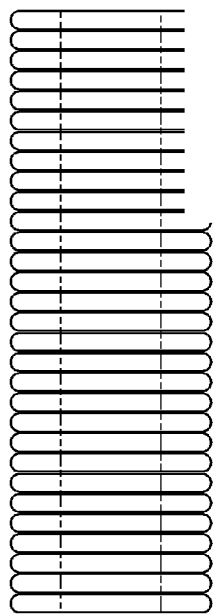
FIGS. 31A-31B are diagrams illustrating a heat source in a modification of the tenth example, where
Figure 31B:
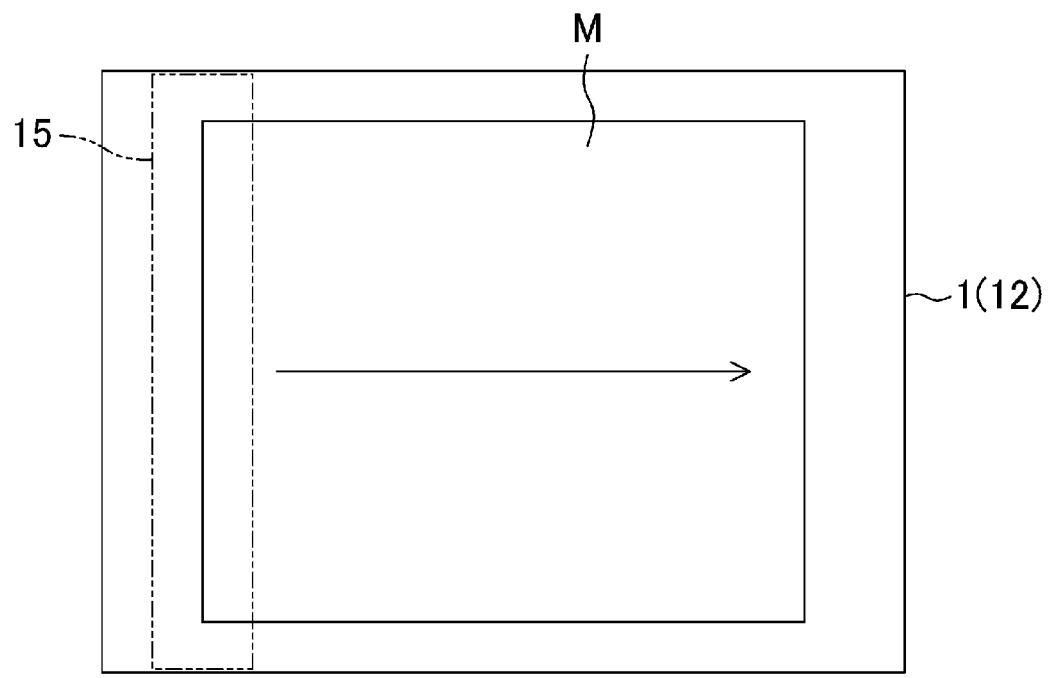

FIGS. 31A-31B show a modification of the tenth example. In this modification, as shown in FIG. 31A, 30 xenon flash lamps having a width of 1 cm and a length of 10 cm were arranged next to each other to form the heat source 15. In this case, the range capable of uniformly radiating light in the heat source 15 was a range with a size of 5 cm by 25 cm. The heat source 15 was configured so as to be movable parallel to the transfer substrate 12 in the longitudinal direction thereof in the vacuum chamber 14.

With the heat source 15 thus configured, irradiation was performed a total of six times while moving the heat source 15 by 5 cm at a time from one longitudinal end to the other longitudinal end of the transfer substrate 12, as shown by arrow in FIG. 31B. The entire effective area of the organic EL element was irradiated with light in this manner.

Eleventh Example

This example is different from the first example in that the pressure bonding apparatus 27 shown in FIGS. 10A-10B was used in the depressurization step in order to bring the transfer substrate 12 and the element substrate 1 into close contact with each other.

In this example, the transfer substrate 12 and the element substrate 1 were placed on a platform 27c so as to face each other. Then, the vacuum chamber 14 was depressurized to a predetermined degree of vacuum. Thereafter, the platform 27c was lifted to bring the transfer substrate 12 into close contact with the heat source 15, and was further lifted to press the substrates 1, 12 under a load of 1 kg/cm$^2$.

This example is advantageous in that the depressurization step can be performed in a shorter time than the first example.

Twelfth Example

This example is different from the first example in that the film-forming solution is produced by dispersing a stacking material in a solvent.

Some stacking materials are less likely to dissolve in organic solvents, and some stacking materials are not suitable for low boiling-point solvents. Such stacking materials can also be used by dispersion in the film-forming solution.

For example, Alq3 as a stacking material of the light emitting layer 43 is insoluble in ethanol. Alq3 forms agglomerates even if it is stirred. Thus, an ionic dispersion additive was added to ethanol containing Alq3, thereby producing a film-forming solution having Alq3 dispersed therein. A surfactant may be added to form a micellar structure. In this example, in order to further improve dispersibility, Alq3 was dispersed by using an ultrasonic homogenizer ("S-250D" made by Branson Ultrasonics Div. of Emerson Japan, Ltd.), whereby a dispersion with a small particle size was able to be obtained.

A film-forming treatment was performed in a manner similar to that of the first example by using the dispersion thus produced. A large number of agglomerates having a size of about several micrometers were present in the resultant transfer layer 11. However, the light emitting layer 43 subsequently formed by transferring the transfer layer 11 to the element substrate 1 had a substantially uniform structure. It seems that such a uniform structure was obtained when the transfer layer 11 was transferred in the subsequent transfer step.

In the transfer step, since heating was performed in the vacuum chamber 14, the additive was evaporated, and no additive was contained in the light emitting layer 43.

Thirteenth Example

The organic EL element of this example has a structure preferable for lighting apparatuses. Light emitting elements having the organic EL element of this example can be mainly used as backlights of liquid crystal display devices, or white light sources (lighting).

(Structure of Light Emitting Element)

Figure 32:
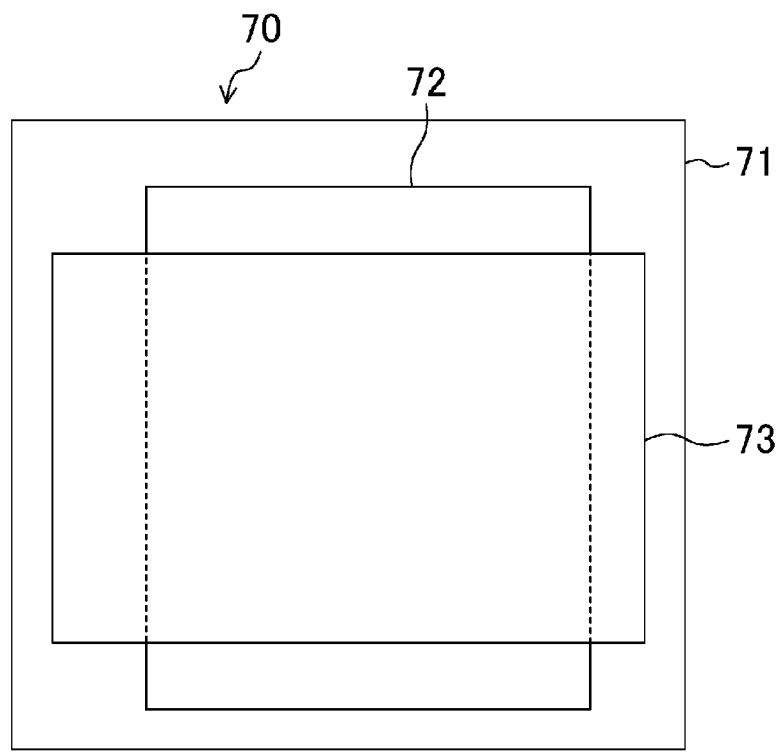
FIG. 32 is a schematic plan view of a light emitting element in a thirteenth example.
Figure 33:
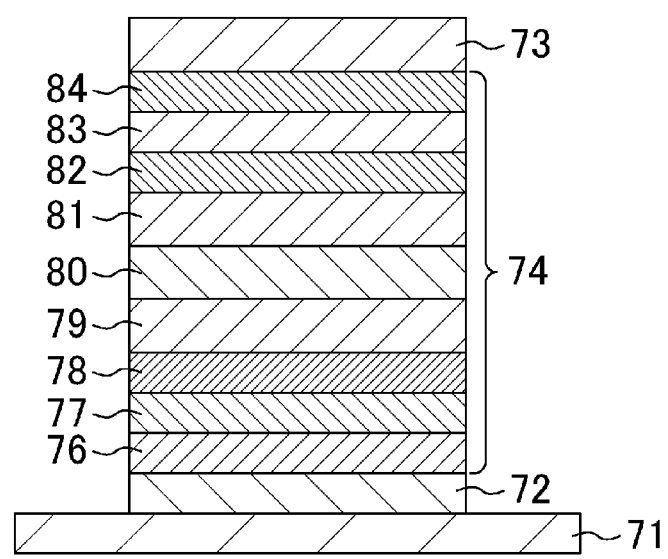
FIG. 33 is a schematic cross-sectional view showing a stacked structure of the light emitting element in the thirteenth example.

FIGS. 32-33 show a light emitting element 70 of the present embodiment. This light emitting element 70 has a bottom emission structure, and emits white light from a light emitting region provided on substantially the entire surface thereof. It should be understood that the light emitting element 70 may emit light other than the white light, and may have a top emission structure.

In FIG. 32, reference character "71" represents a substrate, reference character "72" represents a lower electrode (an anode), and reference character "73" represents an upper electrode (a cathode). An organic layer 74 is provided between the anode 72 and the cathode 73. As shown in FIG. 33, the organic layer 74 is formed by sequentially stacking from the side of the substrate 71 a hole injection layer 76, a hole transport layer 77, an electron blocking layer 78, an R-light emitting layer 79, a G-light emitting layer 80, a B-light emitting layer 81, a hole blocking layer 82, an electron transport layer 83, and an electron injection layer 84.

The anode 72 and the cathode 73 are arranged so as to extend perpendicularly to each other. The entire region where the cathode 73 and the anode 72 overlap each other in the vertical direction serves as a light emitting region.

(Manufacturing Method of Light Emitting Element 70)

An anode 72 comprised of indium tin oxide (ITO) was formed with a thickness of 150 nm on a surface of a polyethylene terephthalate (PET) film (a substrate 71) having a rectangular shape of 60 mm by 60 mm The anode 72 was patterned by photolithography so as to have dimensions of 50 mm by 55 mm The substrate 71 having the anode 72 thereon was ultrasonically cleaned for 10 minutes with, e.g., acetone or IPA, and then was UV-ozone cleaned for 30 minutes.

Thereafter, spacers 13 were patterned on the cleaned substrate 71. Specifically, the spacers 13 having a height of 3 μm from the substrate 71 and a maximum width of 30 μm were formed at intervals of 120 μm by photolithography. The spacers 13 were comprised of photosensitive polyimide (made by NISSAN CHEMICAL INDUSTRIES, LTD.). Overall arrangement of the spacers 13 on the substrate 71 was similar to that shown in FIG. 17B. An element substrate 1 thus formed was treated in a manner similar to that of the first example to form the organic layers other than the electron injection layer 84 thereon.

Specifically, a material of each layer was dissolved at a respective predetermined concentration in a solvent such as chloroform, NMP, or THF to produce a film-forming solution for each layer. The material concentration of each film-forming solution is in the range of 1 to 10 wt %. A transfer substrate 12 was fabricated in a manner similar to that of the first example by using these film-forming solutions, and a transfer layer 11 was transferred to the element substrate 1 to form an organic film 5 of each layer on the element substrate 1.

First, a hole injection layer 76 comprised of copper phthalocyanine (CuPc) was formed with a thickness of 30 nm on the anode 72. Then, a hole transport layer 77 comprised of 4'-bis[N-(1-naphthyl)-N-phenylamino]biphenyl (α-NPD) was formed with a thickness of 20 nm on the hole injection layer 76. Thereafter, an electron blocking layer 78 comprised of 4,4'-bis[N,N'-(3-tolyl)amino]-3,3'-dimethylbiphenyl (HMTPD) was formed with a thickness of 10 nm on the hole transport layer 77.

A red-light emitting layer (thickness: e.g., 20 nm, an R-light emitting layer 79) capable of transporting both holes and electrons was formed on the electron blocking layer 78. The film-forming solution of the R-light emitting layer 79 was produced by dissolving α-NPD as the material of the hole transport layer 77, 3-phenyl-4(1'-naphthyl)-5-phenyl-1,2,4-toriazol (TAZ) as the material of an electron transport layer 83, and bis(2-(2'-benzo[4,5-α]thienyl)pyridinato-N, C3')iridium (acetylacetonate) (btp2lr(acac)) as a red-light emitting dopant at a concentration ratio of 0.6:1.4:0.15. If these materials are uniformly dissolved in the film-forming solution, an organic film can be formed which has the same composition as that of a film that is formed by using these three materials by a codeposition method.

A green-light emitting layer (thickness: e.g., 20 nm, a G-light emitting layer 80) capable of transporting both holes and electrons was formed on the R-light emitting layer 79. The film-forming solution of the G-light emitting layer 80 was produced by dissolving α-NPD as the material of the hole transport layer 77, TAZ as the material of the electron transport layer 83, and Ir(ppy)$_3$ as a green-light emitting dopant at a concentration ratio of 1.0:1.0:0.1.

A blue-light emitting layer (thickness: e.g., 10 nm, a B-light emitting layer 81) capable of transporting both holes and electrons was formed on the G-light emitting layer 68. The film-forming solution of the B-light emitting layer 81 was produced by dissolving α-NPD as the material of the hole transport layer 77, TAZ as the material of the electron transport layer 83, and 2-(4'-t-butylphenyl)-5-(4"-biphenylyl)-1,3,4-oxadiazole (tBu-PBD) as a blue-light emitting dopant at a concentration ratio of 1.5:0.5:0.2. A white-light emitting layer that emits white light is obtained by these three light emitting layers 79, 80, 81.

A hole blocking layer 82 comprised of 2,9-dimethyl-4,7-diphenyl-1,10-phenanthroline (BCP) was formed with a thickness of 10 nm on the B-light emitting layer 81. An electron transport layer 83 comprised of tris(8-hydroxyquinoline)aluminum (Alq3) was formed with a thickness of 30 nm on the hole blocking layer 82.

An electron injection layer 84 comprised of lithium fluoride (LiF) was formed with a thickness of 1 nm on the electron transport layer 83 by a vacuum deposition method. Moreover, aluminum was deposited with a thickness of, e.g., 300 nm on the electron injection layer 84 by a vacuum deposition method to form a cathode 73. Note that the chemical formulae of main materials are shown in FIG. 34.

(Performance of Light Emitting Element)

White light emission of 5,500 cd/m$^2$ was obtained by applying a voltage of 10 V to the completed light emitting element 70.

A light emitting element (a comparative example) having a structure similar to that of the light emitting element 70 (the example) of the present embodiment was fabricated by a vacuum deposition method, and characteristics of these light emitting elements were compared.

According to the comparison result, a 10% decrease in luminance was recognized in the example as compared to the comparative example. However, since the area effective for light emission is reduced by about 10% by the spacers, it seems that this decrease in luminance does not indicate degradation of characteristics of the organic EL element itself.

The material utilization efficiency of the example was 85% or more. Since the material utilization efficiency is about 10% in a common vapor deposition method, the material utilization efficiency was able to be significantly improved in the example. Moreover, the cycle time was able to be reduced, and productivity was able to be improved.

INDUSTRIAL APPLICABILITY

The present invention is preferable not only for displays for TVs or personal computers (PCs), but also for camcorders, digital cameras, navigation systems, audio playback apparatuses (car audio systems, audio components, etc.), game machines, portable information terminals (mobile computers, mobile phones, portable game machines, electronic books, etc.). It should be understood that the present invention is applicable to various lighting apparatuses.

DESCRIPTION OF REFERENCE CHARACTERS

1 Element Substrate
2 Anode
3 Cathode
4 Organic Layer
5 Organic Film
10 Donor Substrate
11 Transfer Layer
12 Transfer Substrate
13 Spacer
13a Surrounding Surface
13b, 13c End
13A Outer Peripheral Spacer
13B Dummy Spacer
14 Vacuum Chamber
15 Heat Source
15a Element Heat Source
16 Heat Generating Layer
20 Pixel Electrode
21 Opening
21a Air Outlet
22 Surrounding Portion
24 Hermetically Sealed Space
27 Pressure Bonding Apparatus
42 Hole Transport Layer
43 Light Emitting Layer
45 Electron Injection Layer
56 Lighting Portion
70 Light Emitting Element
71 Glass Substrate
72 Lower Electrode (Anode)
73 Upper Electrode (Cathode)
74 Organic Layer
76 Hole Injection Layer
77 Hole Transport Layer
78 Electron Blocking Layer
79 R-Light Emitting Layer
80 G-Light Emitting Layer
81 B-Light Emitting Layer
82 Hole Blocking Layer
83 Electron Transport Layer
84 Electron Injection Layer
C Center
S1, S2 Axis of Symmetry
M Effective Area

The invention claimed is:

1. A method for manufacturing an organic EL element including
    an element substrate,
    a pair of electrodes comprised of an anode and a cathode and provided over the element substrate, and
    an organic layer formed between the electrodes and including a light emitting layer that emits light in response to application of a voltage, comprising:
    a lower electrode formation step of forming a lower one of the pair of electrodes on the element substrate;
    a transfer substrate fabrication step of forming a transfer layer by performing a film-forming treatment of forming a film on a donor substrate by using at least one film-forming solution including a stacking material forming the organic layer, thereby fabricating a transfer substrate;

an opposing arrangement step of arranging the transfer substrate and the element substrate so as to face each other with spacers interposed therebetween, such that a surface of the transfer substrate, which has the transfer layer formed thereon, faces the element substrate having the lower electrode formed thereon;

a depressurization step of holding the transfer substrate and the element substrate, which face each other, under vacuum conditions; and a transfer step of heating the transfer substrate under the vacuum conditions by a heat source to transfer the transfer layer to the element substrate, wherein, in the transfer substrate fabrication step, a low boiling-point material is used as a solvent of the film-forming solution.

2. The method of claim 1, wherein
the transfer layer is comprised of a low molecular organic material.

3. The method of claim 1, wherein
the donor substrate is comprised of a material that allows thermal energy emitted from the heat source to pass therethrough.

4. The method of claim 3, wherein
a heat generating layer that absorbs the thermal energy is provided on a surface of the donor substrate on which the transfer layer is provided.

5. The method of claim 1, wherein
the donor substrate is comprised of a material that absorbs thermal energy emitted from the heat source.

6. The method of claim 1, wherein
the spacers are provided on the element substrate.

7. The method of claim 1, wherein
the spacers are provided on the donor substrate.

8. The method of claim 1, wherein
the spacers are formed in a pillar shape.

9. The method of claim 1, wherein
the spacers are arranged in a stripe pattern.

10. The method of claim 9, wherein
the transfer layer is formed in a stripe pattern.

11. The method of claim 1, wherein
the lower electrode formation step includes a treatment of patterning an electrode material into a grid shape to form a plurality of pixel electrodes as the lower electrode,
the spacers are arranged so as to surround each of the plurality of pixel electrodes, and
openings are formed in surrounding surfaces of the spacers surrounding each of the plurality of pixel electrodes.

12. The method of claim 1, wherein
the transfer layer is formed on substantially an entire surface of the donor substrate so as to correspond to an area where the organic layer is formed.

13. The method of claim 1, wherein
the lower electrode formation step includes a treatment of patterning an electrode material into a grid shape to form a plurality of pixel electrodes as the lower electrode, and
in the transfer substrate fabrication step, the transfer layer is formed so as to be located inside each of areas corresponding to the pixel electrodes, as viewed in plan.

14. The method of claim 13, wherein
the transfer layer is formed in a spot shape at at least one position in each of the areas corresponding to the pixel electrodes.

15. The method of claim 1, wherein
in the transfer substrate fabrication step, the transfer layer is formed to have a film-like structure in which fine particles are continuously bonded together.

16. The method of claim 15, wherein
the film-forming treatment is performed by using a small droplet spray method in which the film-forming solution is divided into droplets and sprayed.

17. The method of claim 1, wherein
in the transfer substrate fabrication step, the film-forming solution is produced by dispersing the stacking material in a solvent.

18. The method of claim 1, wherein
the transfer substrate fabrication step is performed under atmospheric pressure conditions.

19. The method of claim 1, wherein
the transfer substrate fabrication step is performed under such conditions that a dew-point temperature is −20° C. or less.

20. The method of claim 1, wherein
in the transfer substrate fabrication step, a treatment of heating the donor substrate is performed while the transfer layer is being formed.

21. The method of claim 1, wherein
the transfer step is performed under such conditions that a degree of vacuum is $1 \times 10^{-3}$ Pa or less.

22. The method of claim 1, wherein
in the depressurization step, a treatment of forming a hermetically sealed space between the transfer substrate and the element substrate is performed, and a pressure inside the hermetically sealed space is adjusted so as to be lower than that outside the hermetically sealed space.

23. The method of claim 1, wherein
in the depressurization step, a treatment of physically bringing the transfer substrate and the element substrate into close contact with each other is performed by a pressure bonding apparatus.

24. The method of claim 1, wherein
the transfer substrate includes a heat generating layer,
a light emitting apparatus is used as the heat source, and
the heat generating layer generates heat by absorbing light that is emitted from the light emitting apparatus.

25. The method of claim 1, wherein
a light emitting apparatus that emits infrared light is used as the heat source.

26. The method of claim 1, wherein
the heat source emits pulsed radiation of thermal energy.

27. The method of claim 1, wherein
in the transfer step, at least two different regions of the transfer substrate are heated by the heat source to perform transfer a plurality of times.

28. The method of claim 1, wherein
a substrate with spacers is formed by providing the spacers on at least one of the transfer substrate and the element substrate,
a plurality of surrounding portions defined by the spacers are formed on one primary surface of the substrate with spacers,
openings are formed in the surrounding surfaces of the spacers respectively surrounding the plurality of surrounding portions,
the plurality of surrounding portions communicate with each other via the openings, and
at least one of the openings can be placed at an end of the substrate with spacers so as to serve as an air outlet.

29. The method of claim 28, wherein
the spacers include an outer peripheral spacer provided in a peripheral portion of the substrate with spacers so as to surround the substrate with spacers, and
the air outlet is provided in a surrounding surface of the outer peripheral spacer.

30. The method of claim 29, wherein
the substrate with spacers is formed in a rectangular shape, and
the outer peripheral spacer is formed symmetrically with respect to at least one of imaginary axes of symmetry extending along sides of the substrate with spacers and extending through a center of the primary surface.

31. The method of claim 29, wherein
the substrate with spacers is formed in a rectangular shape,
the outer peripheral spacer is formed asymmetrically with respect to at least one of imaginary axes of symmetry extending along sides of the substrate with spacers and extending through a center of the primary surface, and
a dummy spacer complementing line symmetry of the outer peripheral spacer is provided in a periphery of the outer peripheral spacer.

32. An organic EL element that is manufactured by using the method of claim 1, comprising:
the spacers provided on the element substrate; and
an equal-thickness layer included in the organic layer and having substantially a same thickness both on the element substrate and on the spacers.

33. An organic EL lighting apparatus, comprising:
the organic EL element of claim 32.

34. A method for manufacturing an organic EL element including
an element substrate,
a pair of electrodes comprised of an anode and a cathode and provided over the element substrate, and
an organic layer formed between the electrodes and including a light emitting layer that emits light in response to application of a voltage, comprising:

a lower electrode formation step of forming a lower one of the pair of electrodes on the element substrate;

a transfer substrate fabrication step of forming a transfer layer by performing a film-forming treatment of forming a film on a donor substrate by using at least one film-forming solution including a stacking material forming the organic layer, thereby fabricating a transfer substrate;

an opposing arrangement step of arranging the transfer substrate and the element substrate so as to face each other with spacers interposed therebetween, such that a surface of the transfer substrate, which has the transfer layer formed thereon, faces the element substrate having the lower electrode formed thereon;

a depressurization step of holding the transfer substrate and the element substrate, which face each other, under vacuum conditions; and a transfer step of heating the transfer substrate under the vacuum conditions by a heat source to transfer the transfer layer to the element substrate, wherein, in the transfer substrate fabrication step, the film-forming solution is produced by dispersing the stacking material in a solvent, and the film-forming solution contains an additive that enhances dispersibility of the stacking material.

35. The method of claim 34, wherein
a treatment of thermally decomposing the additive is performed in the transfer substrate fabrication step.

* * * * *